United States Patent
Okano

(10) Patent No.: US 8,791,028 B2
(45) Date of Patent: Jul. 29, 2014

(54) SEMICONDUCTOR DEVICE AND MANUFACTURING METHOD OF SEMICONDUCTOR DEVICE

(75) Inventor: Kimitoshi Okano, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 71 days.

(21) Appl. No.: 13/571,981

(22) Filed: Aug. 10, 2012

(65) Prior Publication Data

US 2013/0037869 A1 Feb. 14, 2013

(30) Foreign Application Priority Data

Aug. 10, 2011 (JP) .................. 2011-174712

(51) Int. Cl.
*H01L 21/461* (2006.01)
*H01L 29/66* (2006.01)
*H01L 29/78* (2006.01)

(52) U.S. Cl.
CPC ........ *H01L 29/785* (2013.01); *H01L 29/66795* (2013.01); *H01L 29/6681* (2013.01)
USPC ........... 438/738; 438/712; 438/714; 438/691; 438/692; 438/706; 438/704; 438/745; 257/288; 257/E29.264; 257/E29.275; 257/E29.319; 257/E21.409

(58) Field of Classification Search
CPC .................................................... H01L 29/785
USPC ........... 257/288, E29.264, E29.275, E29.319, 257/E21.409; 438/712, 714, 738, 691, 692, 438/706, 704, 745
See application file for complete search history.

(56) References Cited

U.S. PATENT DOCUMENTS

| | | | |
|---|---|---|---|
| 6,800,885 B1 * | 10/2004 | An et al. ........................ | 257/275 |
| 7,268,396 B2 * | 9/2007 | Lee et al. ...................... | 257/347 |
| 7,678,632 B2 * | 3/2010 | Gossner et al. ............... | 438/197 |
| 7,868,395 B2 | 1/2011 | Watanabe et al. | |
| 7,989,856 B2 | 8/2011 | Goto et al. | |
| 8,021,949 B2 * | 9/2011 | Cheng et al. .................. | 438/302 |
| 8,072,061 B2 * | 12/2011 | Gossner et al. ............... | 257/720 |
| 2004/0145000 A1 * | 7/2004 | An et al. ....................... | 257/270 |

(Continued)

FOREIGN PATENT DOCUMENTS

| | | |
|---|---|---|
| JP | 2010-171106 | 8/2010 |
| JP | 2011-35391 | 2/2011 |
| JP | 2011-71517 | 4/2011 |
| WO | WO 2004/107452 A1 | 12/2004 |

OTHER PUBLICATIONS

U.S. Appl. No. 13/621,487, filed Sep. 17, 2012, Okano.
U.S. Appl. No. 13/599,613, filed Aug. 30, 2012, Okano.

(Continued)

*Primary Examiner* — Matthew W Such
*Assistant Examiner* — Samuel Lair
(74) *Attorney, Agent, or Firm* — Oblon, Spivak, McClelland, Maier & Neustadt, L.L.P.

(57) ABSTRACT

According to one embodiment, a manufacturing method of a semiconductor device includes a step of forming a dummy-fin semiconductor on a semiconductor substrate; a step of forming an insulating layer, into which a lower part of the dummy-fin semiconductor is buried, on the semiconductor substrate; a step of forming a fin semiconductor, which is bonded to a side face at an upper part of the dummy-fin semiconductor, on the insulating layer; and a step of removing the dummy-fin semiconductor on the insulating layer with the fin semiconductor being left on the insulating layer.

11 Claims, 38 Drawing Sheets

(56) References Cited

U.S. PATENT DOCUMENTS

2008/0206934 A1* 8/2008 Jones et al. .................. 438/151
2009/0026505 A1 1/2009 Okano
2009/0256208 A1 10/2009 Okano

OTHER PUBLICATIONS

K. Okano, et al., "Process Integration Technology and Device Characteristics of CMOS FinFET on Bulk Silicon Substrate with sub-10nm Fin Width and 20nm Gate Length", IEDM, 2005, 4 pages.

Digh Hisamoto, et al., "A Fully Depleted Lean-channel Transistor (DELTA)—A novel vertical ultra thin SOI MOSFET—", IEDM, 1989, pp. 833-836.

S. Monfray, et al., "50nm—Gate All Around (GAA)—Silicon on Nothing (SON)—Devices: A Simple Way to Co-integration of GAA Transistors within bulk MOSFET process", Symposium on VLSI Tecnology Digest of Technical Papers, 2002, 2 pages.

A. Kaneko, et al., "Sidewall Transfer Process and Selective Gate Sidewall Spacer Formation Tecnology for Sub-15nm FinFET with Elevated Source/Drain Extension", IEDM, 2005, 4 pages.

* cited by examiner

SEMICONDUCTOR DEVICE AND MANUFACTURING METHOD OF SEMICONDUCTOR DEVICE

CROSS-REFERENCE TO RELATED APPLICATIONS

This application is based upon and claims the benefit of priority from Japanese Patent Application No. 2011-174712, filed on Aug. 10, 2011 the entire contents of which are incorporated herein by reference.

FIELD

Embodiments described herein relate generally to a semiconductor device and a manufacturing method of a semiconductor device.

BACKGROUND

In a field-effect transistor, a short-channel effect becomes noticeable, as the field-effect transistor is microfabricated, and in a conventional single-gate transistor, a high-concentration channel impurity is required to suppress the short-channel effect. However, it has been known that the increase in the concentration of the channel impurity causes a reduction in on-state current due to deterioration in a carrier mobility in the channel, an increase in variability of a threshold voltage due to fluctuation in impurity distribution, and an increase in junction leakage current. Therefore, suppressing the short-channel effect without relying on the increased concentration of the channel impurity is needed to enhance performance of the microfabricated transistor.

There has been proposed many types of multi-gate transistors having plural gate electrodes to a channel, as a method of realizing a suppression of a short-channel effect without relying on the increased concentration of the channel impurity. Since the multi-gate transistors control a channel potential by the plural gate electrodes, the controllability of the gate electrodes over the channel potential is stronger than that of a drain electrode, whereby the short-channel effect can be suppressed without increasing the concentration of the channel impurity. A fin field-effect transistor is one of the multi-gate transistors. When a height of a fin channel is increased, a channel width is increased, whereby on-state current can be increased without increasing the footprint of the transistor. Therefore, it is suited for a cell transistor of a high density memory LSI requiring high drive current, for example.

The fin field-effect transistor is classified into a type formed on a bulk semiconductor substrate, and a type formed on an SOI (Silicon On Insulator) substrate. The former type is preferable from the viewpoint of a semiconductor wafer cost, process compatibility with a conventional planar bulk transistor, and suppression of self-heating. The fin field-effect transistor of the former type needs a punch-through stopper under the fin channel region in order to prevent a leakage current that flows between a source and a drain. In the process of the punch-through stopper formation via ion implantation, an impurity is also doped into the channel. Therefore, this transistor entails a problem that the concentration of the channel impurity is increased.

DETAILED DESCRIPTION

In general, according to one embodiment, a manufacturing method of a semiconductor device includes forming a dummy-fin semiconductor on a semiconductor substrate; forming an insulating layer, into which a lower part of the dummy-fin semiconductor is buried, on the semiconductor substrate; forming fin semiconductors on the surfaces of the dummy-fin semiconductor on the insulating layer; and removing an upper part of the dummy-fin semiconductor with the fin semiconductors being left on the insulating layer.

Exemplary embodiments of the semiconductor device and the manufacturing method of a semiconductor device will be explained below in detail with reference to the accompanying drawings. The present invention is not limited to the following embodiments.

(First Embodiment)

FIGS. 1A, 2A, 3A, 4A, 5A, 6A, 7A, 8A, 9A, 10A, 11A, 12A, 13A, 14A, 15A, 16A and 17A are plan views illustrating a schematic configuration of a semiconductor device according to a first embodiment, while FIGS. 1B, 2B, 3B, 4B, 5B, 6B, 7B, 8B, 9B, 10B, 11B, 12B, 13B, 14B, 15B, 16B, 17B and 17C are cross-sectional views illustrating the schematic configuration of the semiconductor device according to the first embodiment. FIG. 10 is a view illustrating a Ge concentration distribution in a depth direction of a semiconductor layer 2. FIGS. 1B to 17B are cross-sectional views taken along a line A-A in the corresponding FIGS. 1A to 17A, while FIG. 17C is a cross-sectional view taken along a line B-B in FIG. 17A.

Figure 1A:
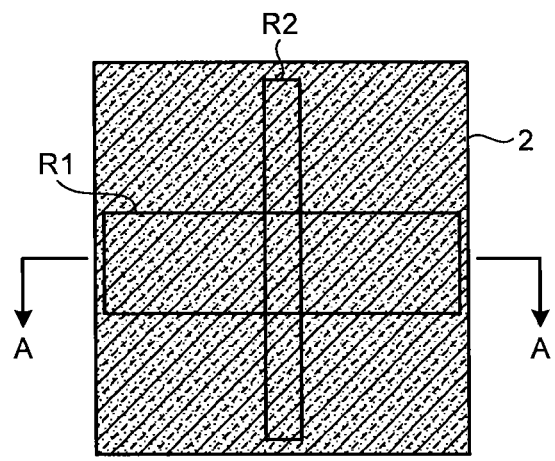
FIG. 1A is a plan view illustrating a manufacturing method of a semiconductor device according to a first embodiment.
Figure 1B:
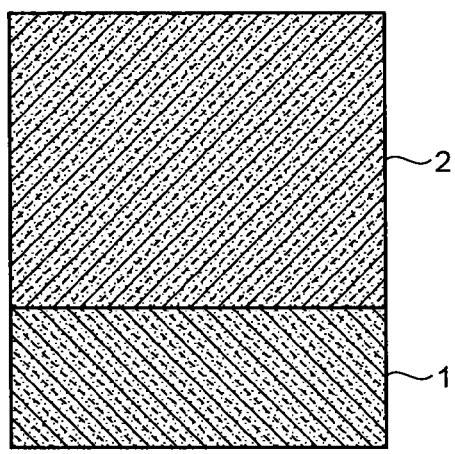
FIG. 1B is a cross-sectional view illustrating the manufacturing method of the semiconductor device according to the first embodiment.
Figure 1C:
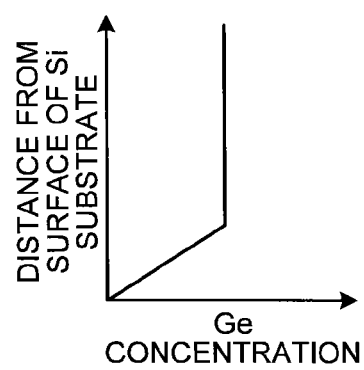
FIG. 1C is a view illustrating a Ge concentration distribution in a depth direction of a semiconductor layer 2.

In FIGS. 1A and 1B, the semiconductor layer 2 is formed on a semiconductor substrate 1 by selective epitaxial growth. On the semiconductor substrate 1, a gate region R1 on which a gate electrode 12 illustrated in FIG. 17B is formed and a dummy-fin semiconductor region R2 on which a dummy-fin semiconductor 4 is formed can be secured.

A material for the semiconductor substrate 1 and the semiconductor layer 2 can be selected from, for example, Si, Ge, SiGe, GaAs, AlGaAs, InP, GaInAsP, GaP, InGaAs, GaN, and SiC. In this case, preferable combination of the materials for the semiconductor substrate 1 and the semiconductor layer 2 is the one that can secure a lattice match between the semiconductor substrate 1 and the semiconductor layer 2, and can gain an etching selectivity between the semiconductor substrate 1 and the semiconductor layer 2. For example, when the semiconductor substrate 1 is made of Si, AlGaAs can be selected as the material for the semiconductor layer 2. When InP is used for the semiconductor substrate 1, GaInAsP can be selected for the material of the semiconductor layer 2.

When the semiconductor substrate 1 is made of Si, and the semiconductor layer 2 is made of SiGe as illustrated in FIG. 10, the concentration of the Ge in the semiconductor layer 2 may be changed in the depth direction in order to secure the lattice match between the semiconductor substrate 1 and the semiconductor layer 2, wherein the concentration of Ge in the semiconductor layer 2 may be decreased toward the interface between the semiconductor substrate 1 and the semiconductor layer 2. As a method for changing the Ge concentration in the semiconductor layer 2 in the depth direction, a method of changing the Ge concentration in a source gas upon the epitaxial growth of the semiconductor layer 2 is employed.

Figure 2A:
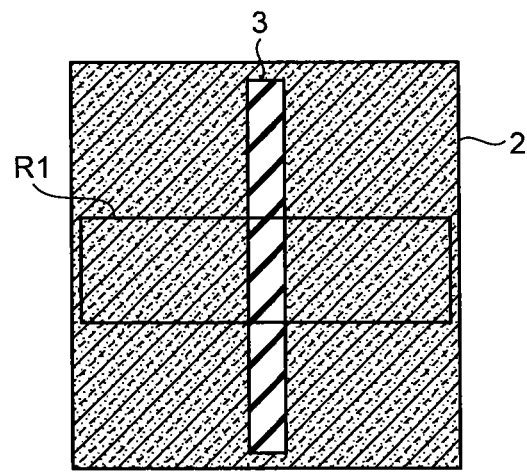
FIG. 2A is a plan view illustrating the manufacturing method of the semiconductor device according to the first embodiment.
Figure 2B:
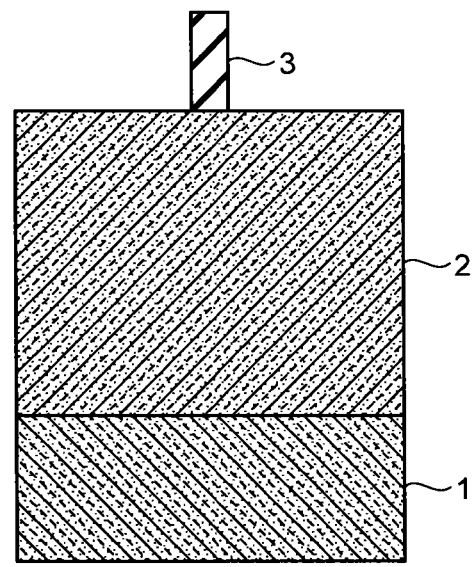
FIG. 2B is a cross-sectional view illustrating the manufacturing method of the semiconductor device according to the first embodiment.

Next, as illustrated in FIGS. 2A and 2B, a hard mask material is deposited all over the semiconductor layer 2 by CVD, for example. The hard mask material is then patterned by photolithography and RIE (Reactive Ion Etching), whereby a hard mask layer 3 is formed on the semiconductor layer 2. $Si_3N_4$ can be used as the material of the hard mask layer 3, for example.

Figure 3A:
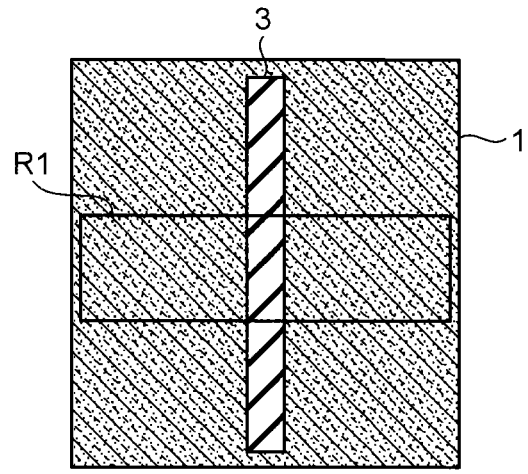
FIG. 3A is a plan view illustrating the manufacturing method of the semiconductor device according to the first embodiment.
Figure 3B:
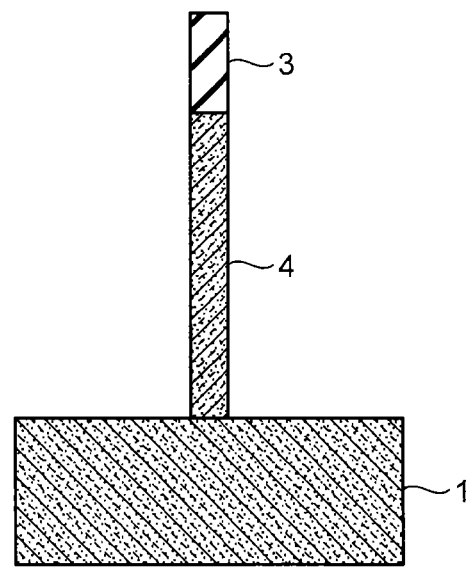
FIG. 3B is a cross-sectional view illustrating the manufacturing method of the semiconductor device according to the first embodiment.

Then, as illustrated in FIGS. 3A and 3B, the semiconductor layer 2 is etched by using the hard mask layer 3 as a mask, whereby a dummy-fin semiconductor 4 is formed on the semiconductor substrate 1.

Figure 4A:
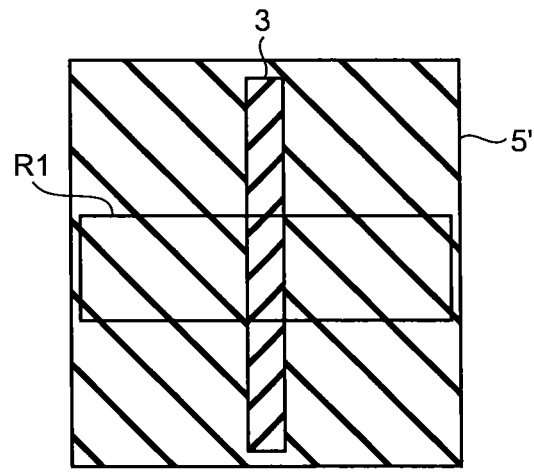
FIG. 4A is a plan view illustrating the manufacturing method of the semiconductor device according to the first embodiment.
Figure 4B:
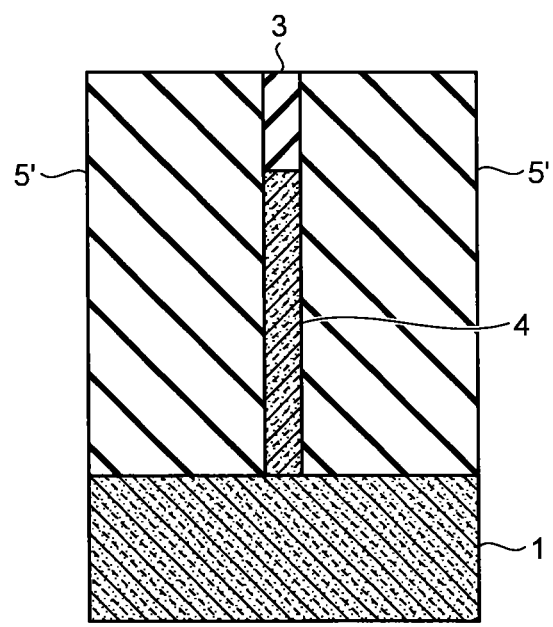
FIG. 4B is a cross-sectional view illustrating the manufacturing method of the semiconductor device according to the first embodiment.

Next, as illustrated in FIGS. 4A and 4B, a buried insulating layer material 5' is deposited on the semiconductor substrate 1 by CVD in such a manner that the dummy-fin semiconductor 4 is buried therein. $SiO_2$ can be used as the buried insulating layer material 5'. The buried insulating layer material 5' is flattened by CMP. In this case, the hard mask layer 3 can be used as an etch stopper during the CMP.

Figure 5A:
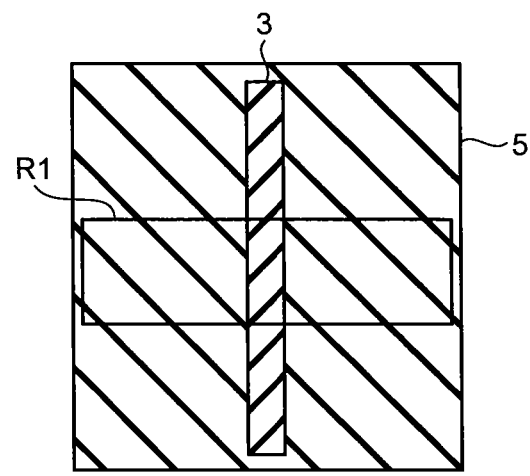
FIG. 5A is a plan view illustrating the manufacturing method of the semiconductor device according to the first embodiment.
Figure 5B:
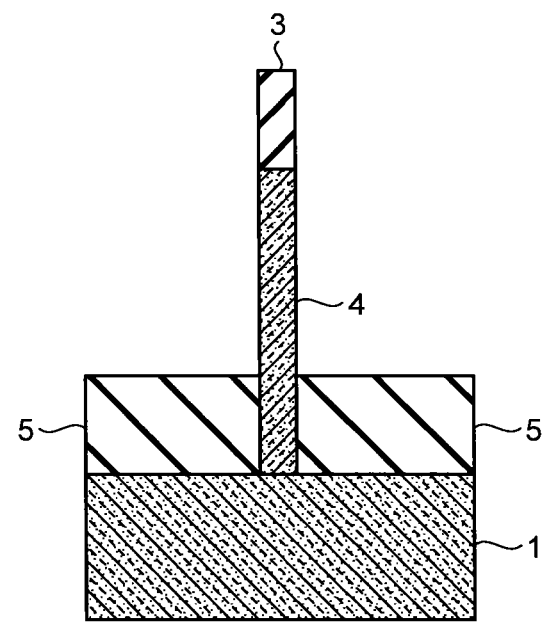
FIG. 5B is a cross-sectional view illustrating the manufacturing method of the semiconductor device according to the first embodiment.

Next, as illustrated in FIGS. 5A and 5B, the buried insulating layer material 5' is etched back so as to expose the upper part of the dummy-fin semiconductor 4 from the buried insulating layer material 5', whereby the buried insulating layer 5 is formed. The buried insulating layer 5 acts as an isolation layer of fin field-effect transistor.

Figure 6A:
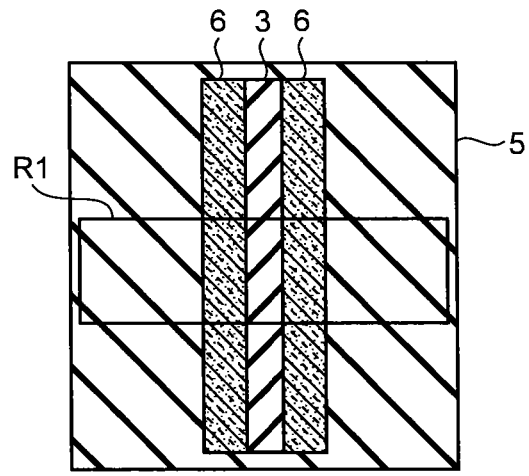
FIG. 6A is a plan view illustrating the manufacturing method of the semiconductor device according to the first embodiment.
Figure 6B:
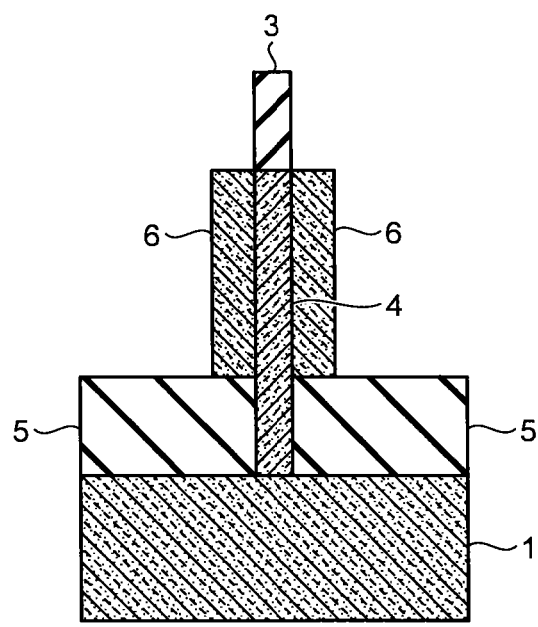
FIG. 6B is a cross-sectional view illustrating the manufacturing method of the semiconductor device according to the first embodiment.

Then, as illustrated in FIGS. 6A and 6B, a fin semiconductor 6 bonded to each side face of the dummy-fin semiconductor 4 is formed on the buried insulating layer 5 by selective epitaxial growth. Examples of the material for the fin semiconductor 6 include Si, Ge, SiGe, GaAs, AlGaAs, InP, GaP, InGaAs, GaN, and SiC. In this case, preferable combination of the materials for the dummy-fin semiconductor 4 and the fin semiconductor 6 is the one that can secure a lattice match between the dummy-fin semiconductor 4 and the fin semiconductor 6, and can gain an etching selectivity between the dummy-fin semiconductor 4 and the fin semiconductor 6. For example, when the dummy-fin semiconductor 4 is made of SiGe, Si can be selected as the material for the fin semiconductor 6.

Figure 7A:
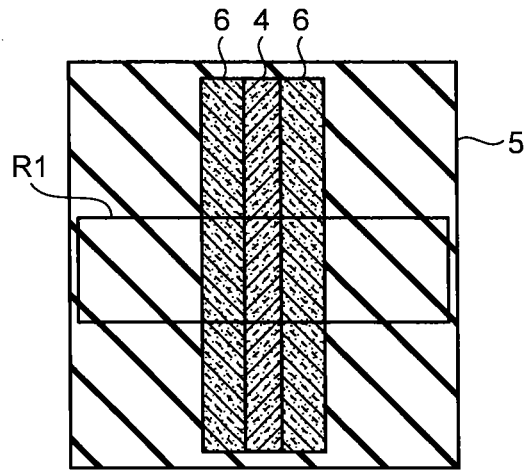
FIG. 7A is a plan view illustrating the manufacturing method of the semiconductor device according to the first embodiment.
Figure 7B:
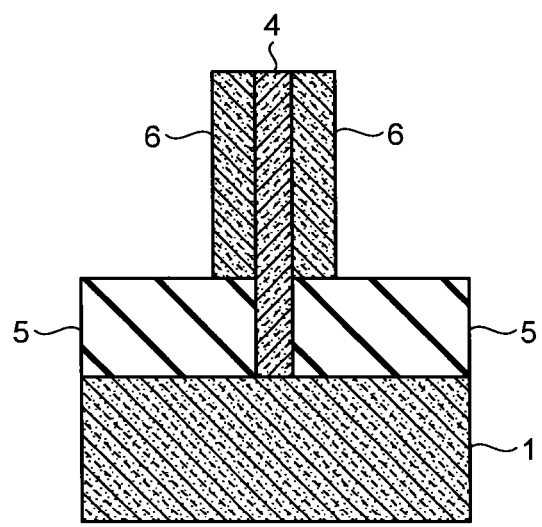
FIG. 7B is a cross-sectional view illustrating the manufacturing method of the semiconductor device according to the first embodiment.

Then, as illustrated in FIGS. 7A and 7B, the hard mask layer 3 on the dummy-fin semiconductor 4 is removed by wet etching.

Figure 8A:
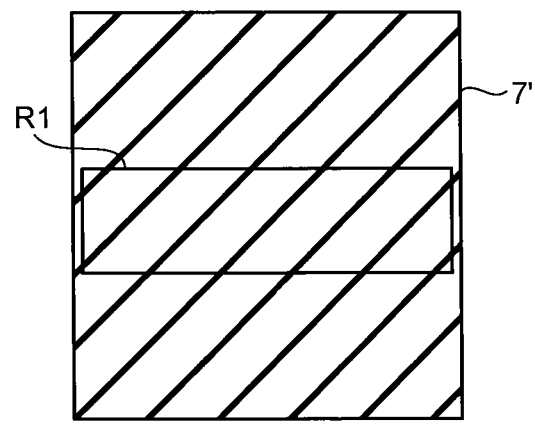
FIG. 8A is a plan view illustrating the manufacturing method of the semiconductor device according to the first embodiment.
Figure 8B:
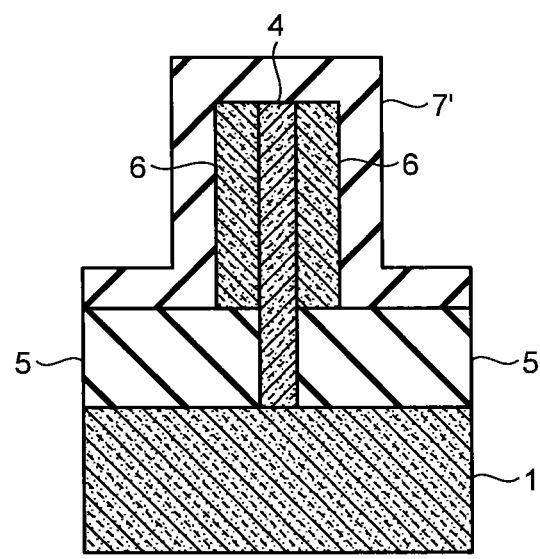
FIG. 8B is a cross-sectional view illustrating the manufacturing method of the semiconductor device according to the first embodiment.

Next, as illustrated in FIGS. 8A and 8B, a sidewall material 7' is deposited. $Si_3N_4$ can be used as the sidewall material 7', for example.

Figure 9A:
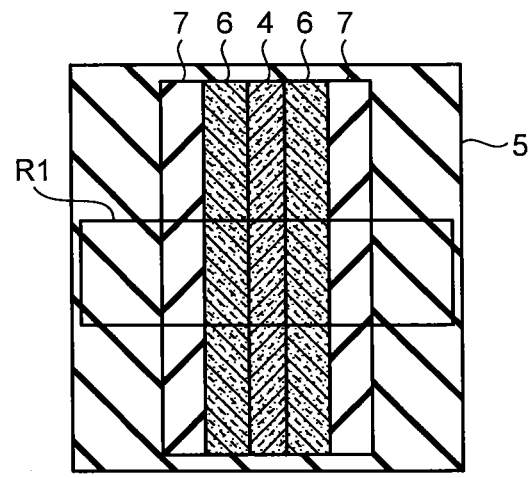
FIG. 9A is a plan view illustrating the manufacturing method of the semiconductor device according to the first embodiment.
Figure 9B:
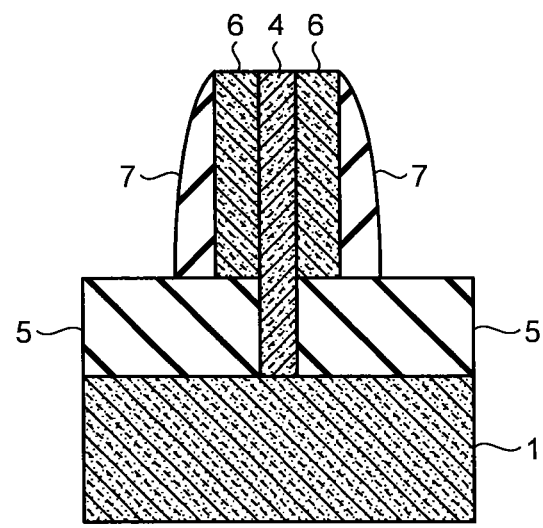
FIG. 9B is a cross-sectional view illustrating the manufacturing method of the semiconductor device according to the first embodiment.
Figure 10A:
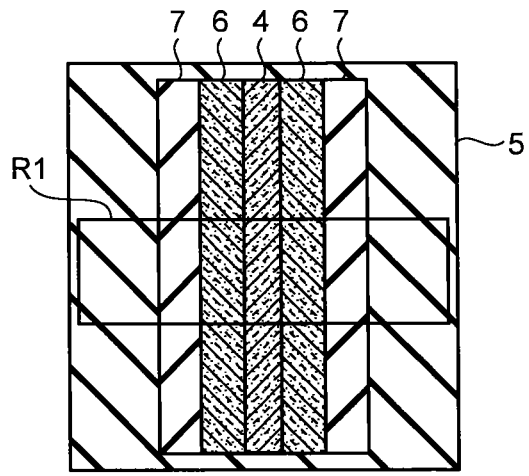
FIG. 10A is a plan view illustrating the manufacturing method of the semiconductor device according to the first embodiment.
Figure 10B:
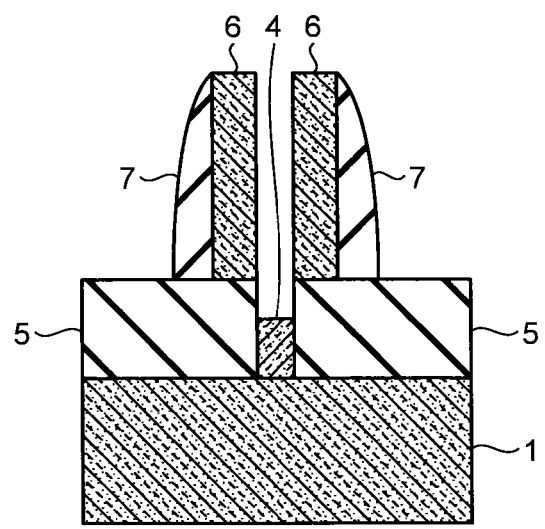
FIG. 10B is a cross-sectional view illustrating the manufacturing method of the semiconductor device according to the first embodiment.

Next, as illustrated in FIGS. 9A and 9B, the sidewall material 7' is etched by RIE, whereby sidewall 7 is formed on the side faces of the fin semiconductor 6.

Next, as illustrated in FIGS. 10A and 10B, the dummy-fin semiconductor 4 is selectively removed by dry etching and the like. In this case, when the dummy-fin semiconductor 4 is made of a material having higher etching rate than that of the material of the fin semiconductor 6, the fin semiconductors 6 can be left on the buried insulating layer 5. Since the sidewall 7 is formed on the side faces of the fin semiconductors 6, the fin semiconductors 6 can be prevented from falling down even if the width of the fin semiconductors 6 is narrow. It is unnecessary to completely remove the dummy-fin semiconductor 4. It is only necessary that the dummy-fin semiconductor 4 located at least above the upper surface of the buried insulating layer 5 is removed.

Figure 11A:
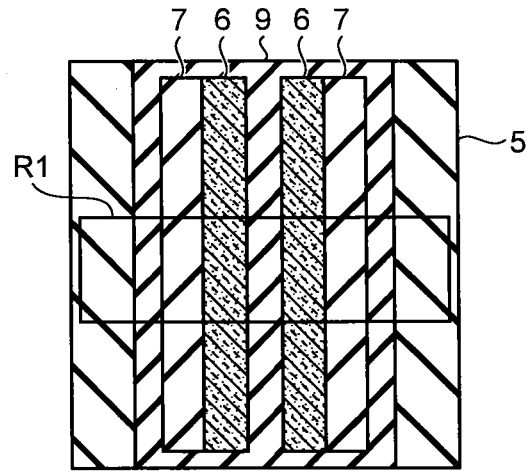
FIG. 11A is a plan view illustrating the manufacturing method of the semiconductor device according to the first embodiment.
Figure 11B:
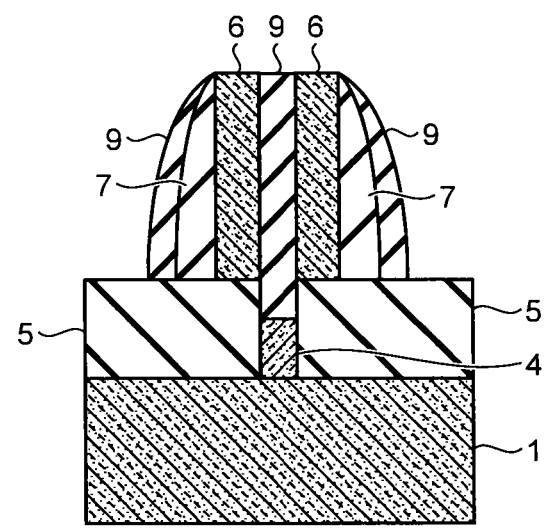
FIG. 11B is a cross-sectional view illustrating the manufacturing method of the semiconductor device according to the first embodiment.

Next, as illustrated in FIGS. 11A and 11B, a protection film 9 is deposited and etched by RIE, whereby space between fin semiconductors 6 is filled with the protection film 9 and sidewall made from the protection film 9 is formed around the sidewall 7. $Si_3N_4$ can be used as the material of the protection film 9, for example.

Figure 12A:
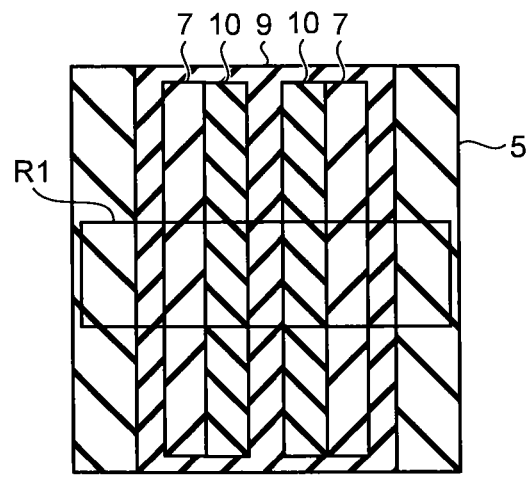
FIG. 12A is a plan view illustrating the manufacturing method of the semiconductor device according to the first embodiment.
Figure 12B:
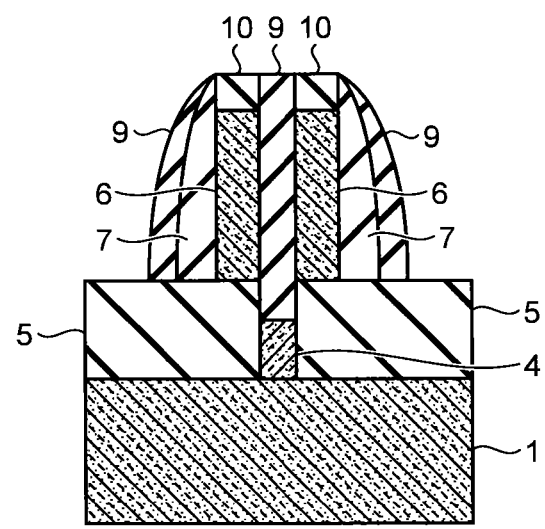
FIG. 12B is a cross-sectional view illustrating the manufacturing method of the semiconductor device according to the first embodiment.

Next, as illustrated in FIGS. 12A and 12B, a cap layer 10 is formed on the fin semiconductors 6 by thermal oxidation.

Figure 13A:
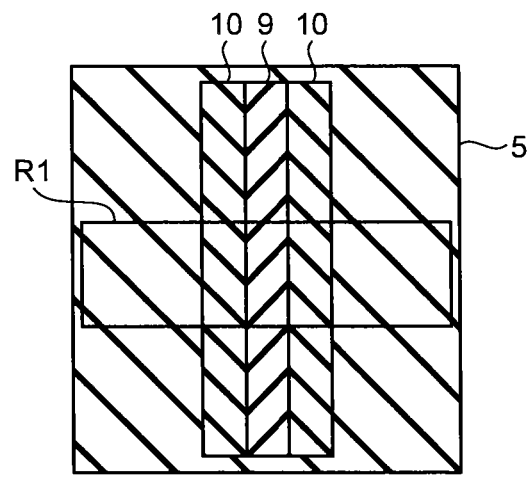
FIG. 13A is a plan view illustrating the manufacturing method of the semiconductor device according to the first embodiment.
Figure 13B:
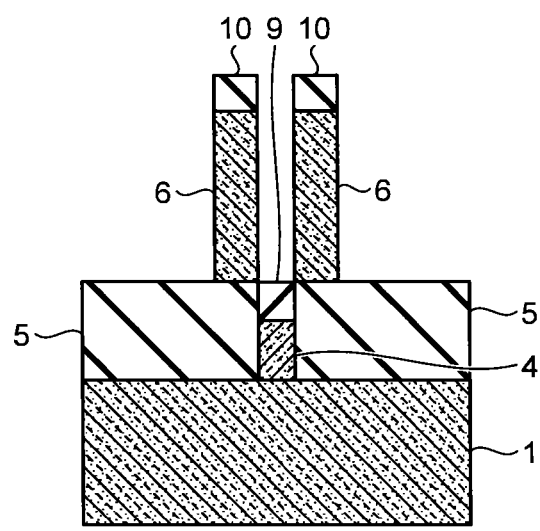
FIG. 13B is a cross-sectional view illustrating the manufacturing method of the semiconductor device according to the first embodiment.

Next, as illustrated in FIGS. 13A and 13B, the sidewall 7 and the protection film 9 on the side faces of the fin semiconductors 6 are removed by wet etching and the like. In this case, part of the protection film 9 may be left on the dummy-fin semiconductor 4, where upper surface of the protection film 9 is located below upper surface of the buried insulating layer 5.

Figure 14A:
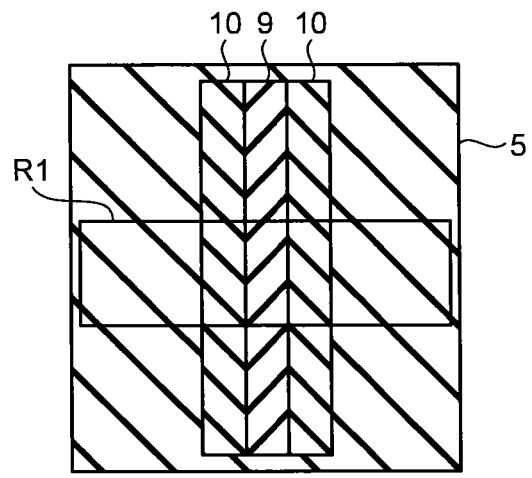
FIG. 14A is a plan view illustrating the manufacturing method of the semiconductor device according to the first embodiment.
Figure 14B:
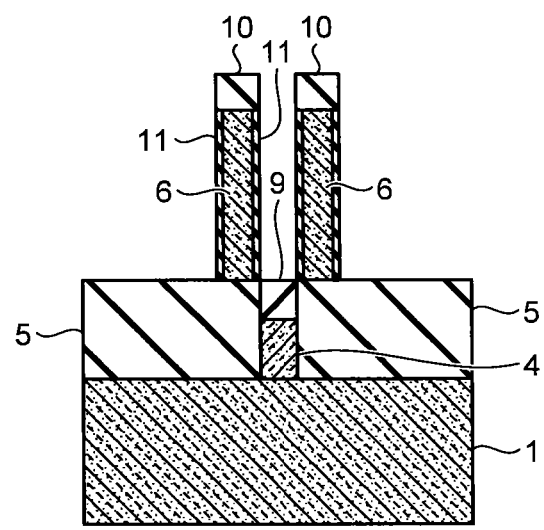
FIG. 14B is a cross-sectional view illustrating the manufacturing method of the semiconductor device according to the first embodiment.

Next, as illustrated in FIGS. 14A and 14B, a gate insulating film 11 is formed on the side faces of the fin semiconductors 6 on the buried insulating layer 5 by thermal oxidation or CVD. The material of the gate insulating film 11 can be selected from $SiO_2$, SiON, HfO, HfSiO, $HfS_tON$, HfAlO, $HfAlS_tON$, and $La_2O_3$.

Figure 15A:
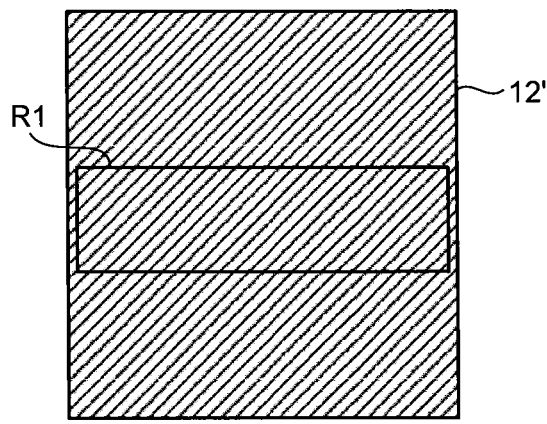
FIG. 15A is a plan view illustrating the manufacturing method of the semiconductor device according to the first embodiment.
Figure 15B:
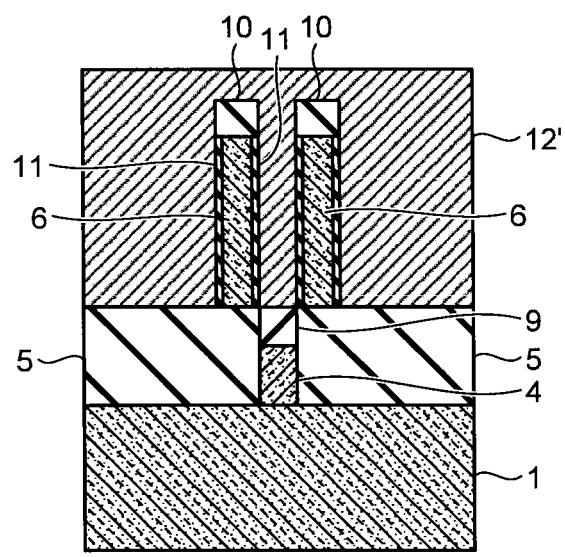
FIG. 15B is a cross-sectional view illustrating the manufacturing method of the semiconductor device according to the first embodiment.

Next, as illustrated in FIGS. 15A and 15B, a gate electrode material 12' is deposited by CVD so as to allow the fin semiconductors 6 to be buried.

Figure 16A:
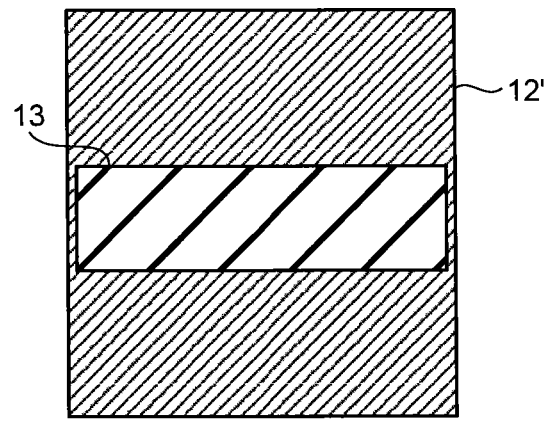
FIG. 16A is a plan view illustrating the manufacturing method of the semiconductor device according to the first embodiment.
Figure 16B:
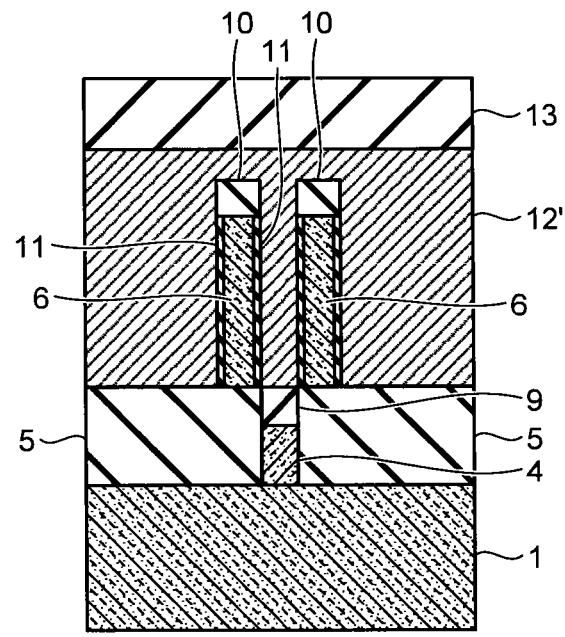
FIG. 16B is a cross-sectional view illustrating the manufacturing method of the semiconductor device according to the first embodiment.

Next, as illustrated in FIGS. 16A and 16B, a hard mask material is deposited on the gate electrode material 12' by CVD. The hard mask material is patterned by photolithography and RIE, whereby a hard mask layer 13 is formed on the gate electrode material 12'.

Figure 17A:
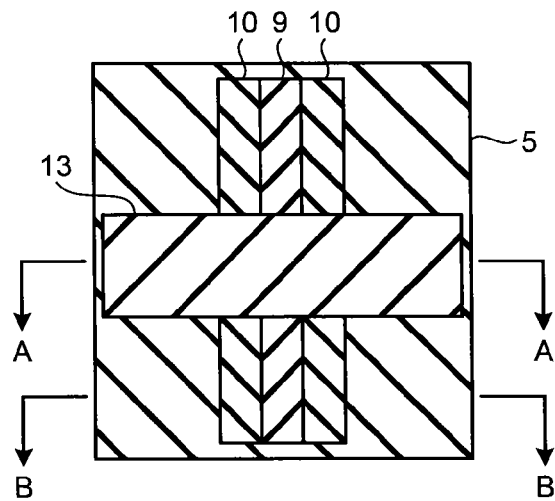
FIG. 17A is a plan view illustrating the manufacturing method of the semiconductor device according to the first embodiment.
Figure 17B:
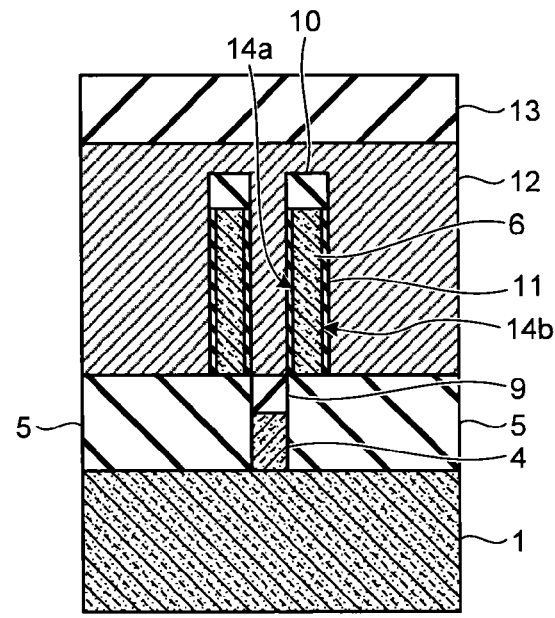
FIGS. 17B and 17C are cross-sectional views illustrating the manufacturing method of the semiconductor device according to the first embodiment.
Figure 17C:
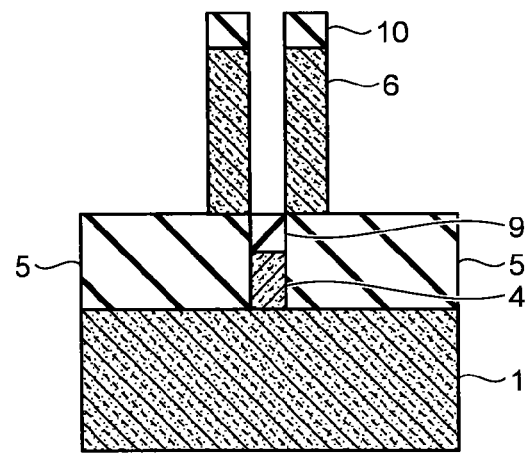

Next, as illustrated in FIGS. 17A to 17C, the gate electrode material 12' is etched through the hard mask layer 13, whereby the gate electrode 12 is formed on the side face of the channel regions 14a and 14b of the fin semiconductor 6 through the gate insulating film 11. Polycrystalline silicon can be used as the material of the gate electrode 12, for example. Alternatively, the material of the gate electrode 12 can be selected from W, Al, TaN, Ru, TiAlN, HfN, NiSi, Mo, and TiN.

In the channel regions 14a and 14b of the fin semiconductor 6, the concentration of the impurity is preferably reduced in order to suppress a variability in electric characteristic of a fin field-effect transistor and a reduction in carrier mobility in the channel regions. The channel regions 14a and 14b may be non-doped. In order to suppress the short-channel effect in fin field-effect transistor with sufficiently reduced channel impurity concentration, it is preferable that the fin width is set smaller than the gate length, more specifically, set to be ⅔ or less of the gate length. The fin field-effect transistor can be formed as a fully-depleted device by sufficiently reducing the channel impurity concentration.

Since the fin semiconductor 6 is formed on the side face of the dummy-fin semiconductor 4 by selective epitaxial growth, the fin semiconductor 6 can be formed on the buried insulating layer 5 without using the SOI substrate. Therefore, the fin field-effect transistor can be formed on the insulator with reduced cost, compared to the case using the SOI substrate.

Since the fin semiconductor 6 is formed by selective epitaxial growth on the side face of the dummy-fin semiconductor 4 which is formed by photolithography and RIE, the surface roughness of the channel region 14b can be made smaller than that of channel region 14a. It is because the far the epitaxial growth front is located from the surface of the dummy-fin semiconductor 4, the more it is not influenced by surface roughness of the dummy-fin semiconductor 4.

As a result, fin semiconductor 6 with reduced surface roughness can be obtained by using this process. This leads to the improvement in the carrier mobility in the channel region by reduced surface roughness scattering and the performance of fin field-effect transistor can be enhanced.

In the first embodiment, the dummy-fin semiconductor 4 and the fin semiconductor 6 are made of different materials in order to gain the etching selectivity between the dummy-fin semiconductor 4 and the fin semiconductor 6. However, the concentration of the impurity may be made different between the dummy-fin semiconductor 4 and the fin semiconductor 6. For example, an impurity-doped silicon may be used for the dummy-fin semiconductor 4, while impurity-nondoped silicon may be used for the fin semiconductor 6. In this case, the impurity-nondoped silicon can selectively be removed by performing a wet etching in which the etching rate for the impurity-doped silicon is larger than the etching rate for the impurity-nondoped silicon. P or As can be used as the impurity, for example, and hot phosphate can be used as chemical solution.

(Second Embodiment)

Figure 18A:
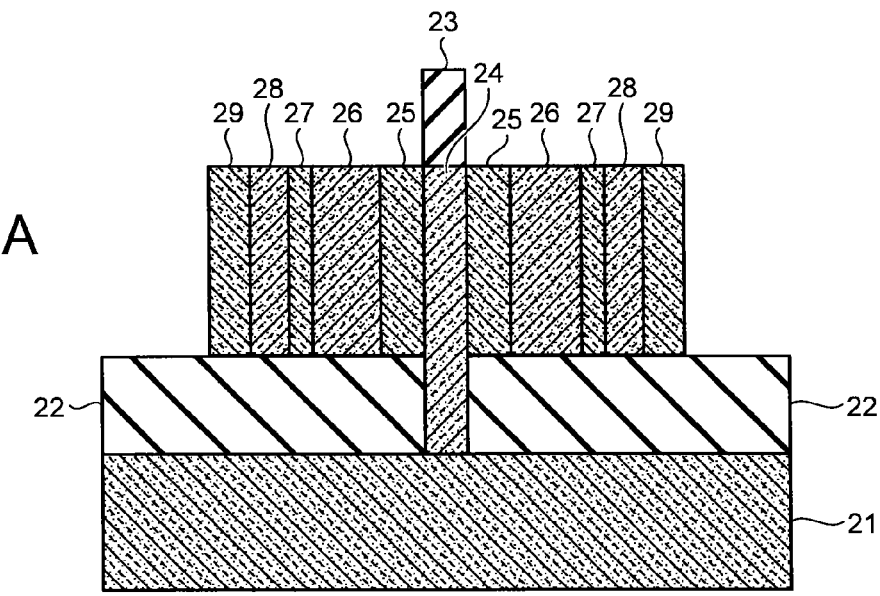
FIGS. 18A and 18B are cross-sectional views illustrating a manufacturing method of a semiconductor device according to a second embodiment.
Figure 18B:
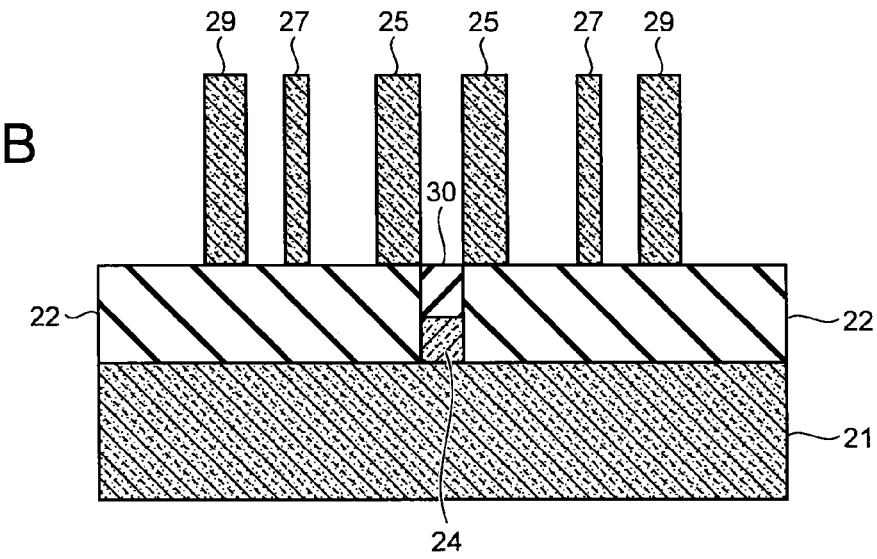

FIGS. 18A and 18B are cross-sectional views illustrating a manufacturing method of a semiconductor device according to the second embodiment.

In FIG. 18A, a dummy-fin semiconductor 24 is formed on a semiconductor substrate 21, and then, a buried insulating layer 22 is formed on the semiconductor substrate 21 in order that a lower part of the dummy-fin semiconductor 24 is buried. In this case, a hard mask layer 23 is formed on the dummy-fin semiconductor 24.

A fin semiconductor 25 bonded to each side face of the dummy-fin semiconductor 24 is formed on the buried insulating layer 22. Then, fin semiconductors 26 bonded to the side faces of the fin semiconductors 25 are formed on the buried insulating layer 22. Next, fin semiconductors 27 bonded to the side faces of the fin semiconductors 26 are formed on the buried insulating layer 22. Next, fin semiconductors 28 bonded to the side faces of the fin semiconductors 27 are formed on the buried insulating layer 22. Next, fin semiconductors 29 bonded to the side faces of the fin semiconductors 28 are formed on the buried insulating layer 22.

The materials for the semiconductor substrate 21, the dummy-fin semiconductor 24, and the fin semiconductors 25 to 29 can be selected from, for example, Si, Ge, SiGe, GaAs, AlGaAs, InP, GaInAsP, GaP, InGaAs, GaN, and SiC. In this case, preferable combination of the materials for the dummy-fin semiconductor 24, the fin semiconductor 26, and the fin semiconductor 28, and the materials for the semiconductor substrate 21 and the fin semiconductors 25 to 29 is the one that can secure a lattice match between the dummy-fin semiconductor 24 and the fin semiconductors 26 and 28, and the semiconductor substrate 21 and the fin semiconductors 25 to 29, and can gain an etching selectivity between the dummy-fin semiconductor 24 and the fin semiconductors 26 and 28, and the semiconductor substrate 21 and the fin semiconductors 25 to 29. For example, when the semiconductor substrate 21 and the fin semiconductors 25 to 29 are made of Si, SiGe can be selected as the materials for the dummy-fin semiconductor 24 and the fin semiconductors 26 and 28.

Then, as illustrated in FIG. 18B, the dummy-fin semiconductor 24 and the fin semiconductors 26 and 28 are selectively removed by a dry etching after the hard mask layer 23 is removed. A protection film 30 may be formed on the dummy-fin semiconductor 24 at the lower part of the buried insulating layer 22 in order to cover the dummy-fin semiconductor 24 by an insulator.

Since the fin semiconductors 25 to 29 are repeatedly and alternately formed on the buried insulating layer 22 in the lateral direction of the dummy-fin semiconductor 24, the fin width and fin space of the fin semiconductors 25 to 29 can freely be set. Therefore, the restriction on the photolithography for the line and space of the fin in the fin field-effect transistor can be relaxed, resulting in that the degree of freedom in a pattern layout of the line and space can be enhanced.
(Third Embodiment)

Figure 21A:
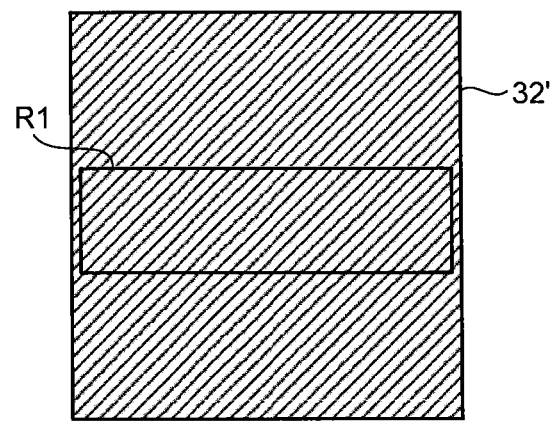
FIG. 21A is a plan view illustrating a manufacturing method of a semiconductor device according to the third embodiment.
Figure 21B:
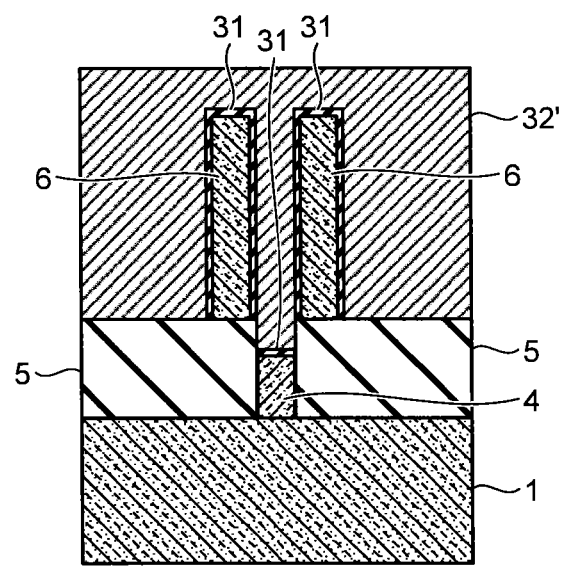
FIG. 21B is a cross-sectional view illustrating the manufacturing method of the semiconductor device according to the third embodiment.
Figure 22A:
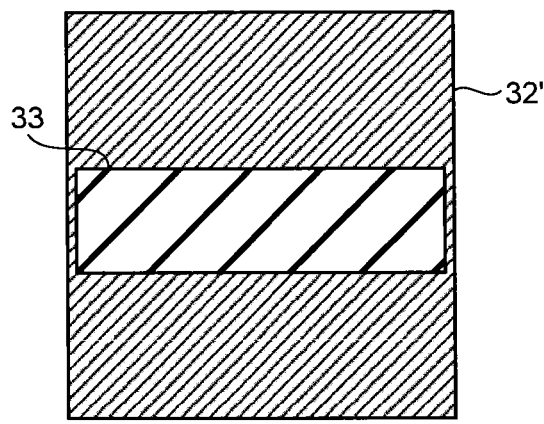
FIG. 22A is a plan view illustrating a manufacturing method of a semiconductor device according to the third embodiment.
Figure 22B:
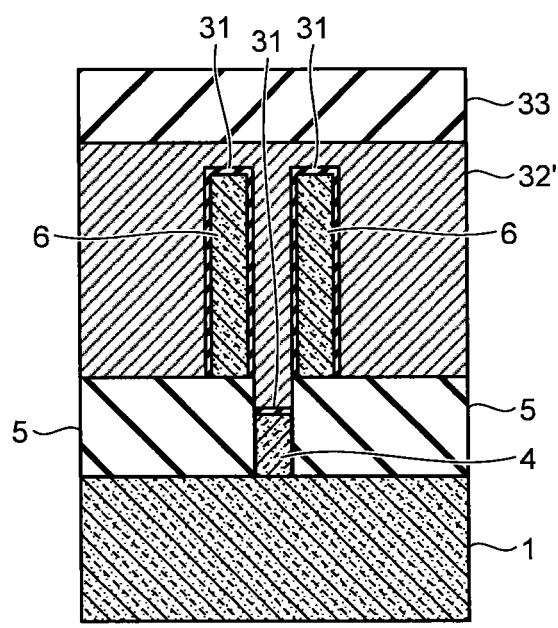
FIG. 22B is a cross-sectional view illustrating the manufacturing method of the semiconductor device according to the third embodiment.
Figure 23A:
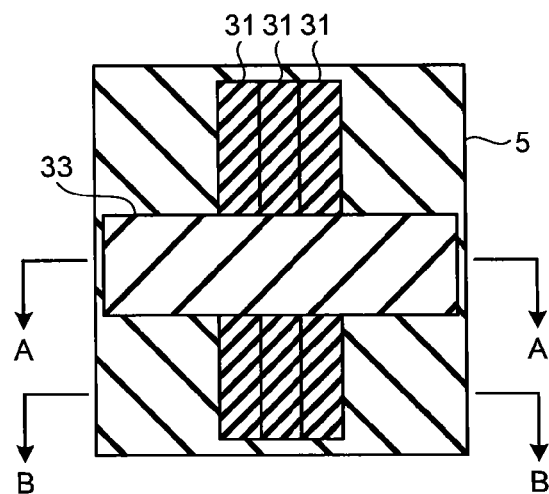
FIG. 23A is a plan view illustrating the manufacturing method of the semiconductor device according to the third embodiment.
Figure 23B:
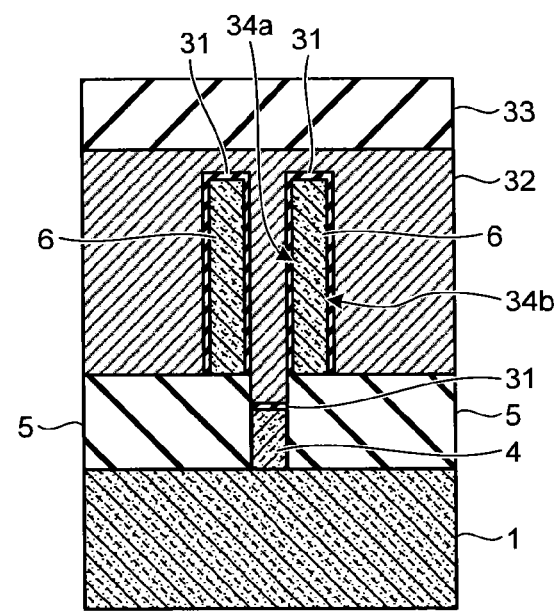
FIGS. 23B and 23C are cross-sectional views illustrating the manufacturing method of the semiconductor device according to the third embodiment.
Figure 23C:
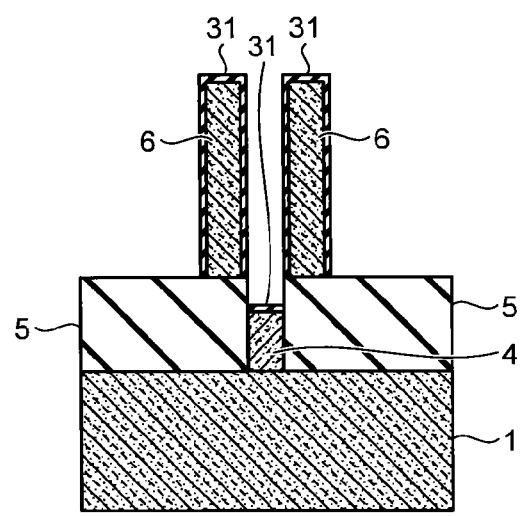

FIGS. 19A, 20A, 21A, 22A and 23A are plan views illustrating a schematic configuration of a semiconductor device according to a third embodiment, while FIGS. 19B, 20B, 21B, 22B, 23B and 23C are cross-sectional views illustrating the schematic configuration of the semiconductor device according to the third embodiment. FIGS. 19B to 23B are cross-sectional views taken along a line A-A in the corresponding FIGS. 19A to 23A, while FIG. 23C is a cross-sectional view taken along a line B-B in FIG. 23A.

Figure 19A:
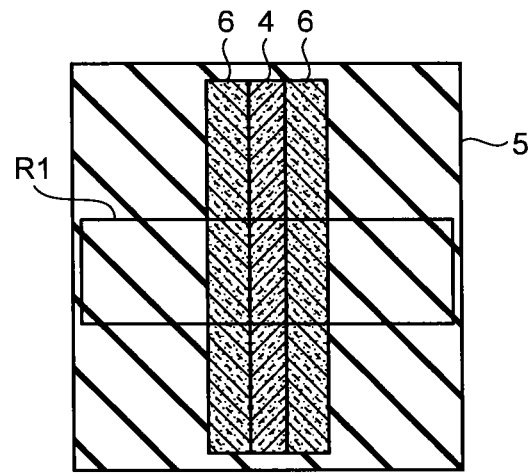
FIG. 19A is a plan view illustrating a manufacturing method of a semiconductor device according to a third embodiment.
Figure 19B:
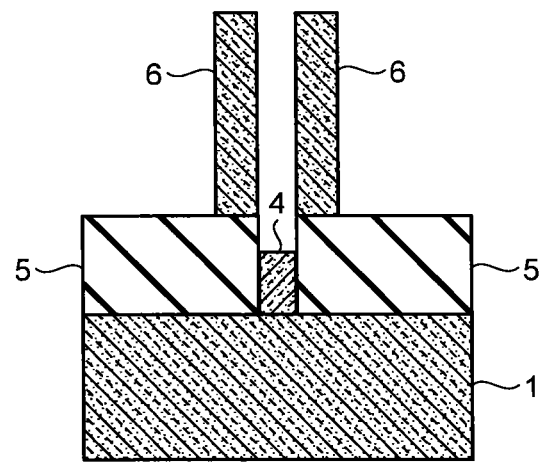
FIG. 19B is a cross-sectional view illustrating the manufacturing method of the semiconductor device according to the third embodiment.

In FIGS. 19A and 19B, the dummy-fin semiconductor 24 is selectively removed by a wet etching after the processes in FIGS. 1A to 7A and FIGS. 1B to 7B. A part of the dummy-fin semiconductor 4 may be left on the lower part of the buried insulating layer 5.

Figure 20A:
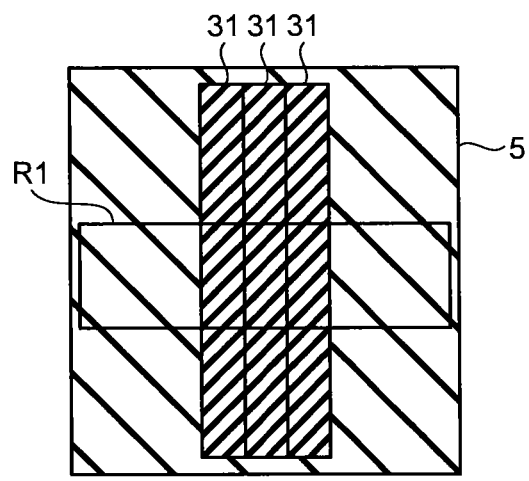
FIG. 20A is a plan view illustrating a manufacturing method of a semiconductor device according to the third embodiment.
Figure 20B:
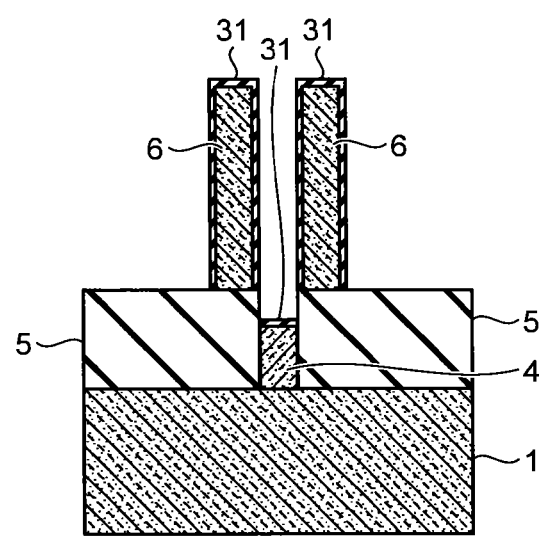
FIG. 20B is a cross-sectional view illustrating the manufacturing method of the semiconductor device according to the third embodiment.

As illustrated in FIGS. 20A and 20B, a gate insulating film 31 is formed on the side faces of the fin semiconductors 6 on the buried insulating layer 5 by thermal oxidation or CVD.

Next, as illustrated in FIGS. 21A and 21B, a gate electrode material 32' is deposited by CVD in such a manner that the fin semiconductor 6 is buried.

Next, as illustrated in FIGS. 22A and 22B, a hard mask material is formed on the gate electrode material 32' by CVD. Then, the hard mask material is patterned by photolithography and RIE to form a hard mask layer 33 on the gate electrode material 32'.

Next, as illustrated in FIGS. 23A to 23C, the gate electrode material 32' is etched by using the hard mask layer 33 as a mask, whereby a gate electrode 32 is formed on the side faces of channel regions 34a and 34b of the fin semiconductor 6 via the gate insulating film 31. In this case, as illustrated in FIG. 23C, the fin semiconductor 6 on the source and drain regions can be protected from the etching for the gate electrode by the gate insulating film remaining above the fin semiconductor 6.

The third embodiment skips the process for forming the sidewall 7 in FIGS. 9A and 9B, resulting in that the number of processes can be reduced.
(Fourth Embodiment)

FIGS. 24A, 25A, 26A, 27A, 28A, 29A, 30A, 31A, 32A, 33A, 34A, 35A, 36A, 37A and 38A are plan views illustrating a schematic configuration of a semiconductor device according to a fourth embodiment, while FIGS. 24B, 25B, 26B, 27B, 28B, 29B, 30B, 31B, 32B, 33B, 34B, 35B, 36B, 37B, 38B and 38C are cross-sectional views illustrating the schematic configuration of the semiconductor device according to the fourth embodiment. FIGS. 24B to 38B are cross-sectional views taken along a line A-A in the corresponding FIGS. 24A to 38A, while FIG. 38C is a cross-sectional view taken along a line B-B in FIG. 38A.

Figure 24A:
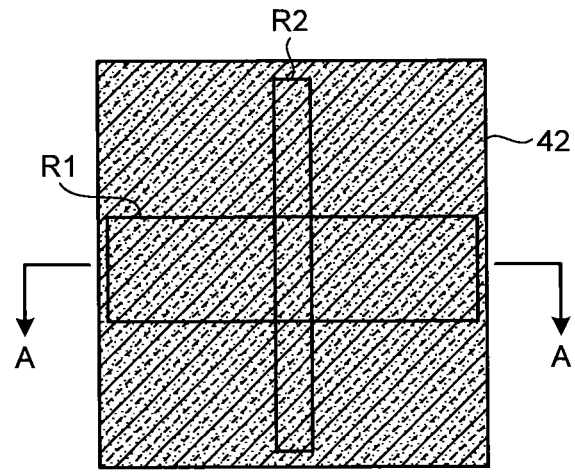
FIG. 24A is a plan view illustrating a manufacturing method of a semiconductor device according to a fourth embodiment.
Figure 24B:
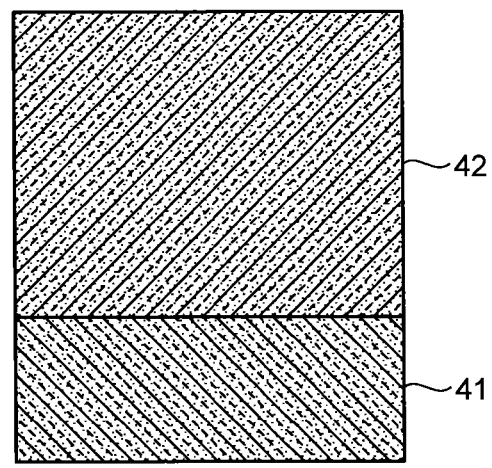
FIG. 24B is a cross-sectional view illustrating the manufacturing method of the semiconductor device according to the fourth embodiment.
Figure 38A:
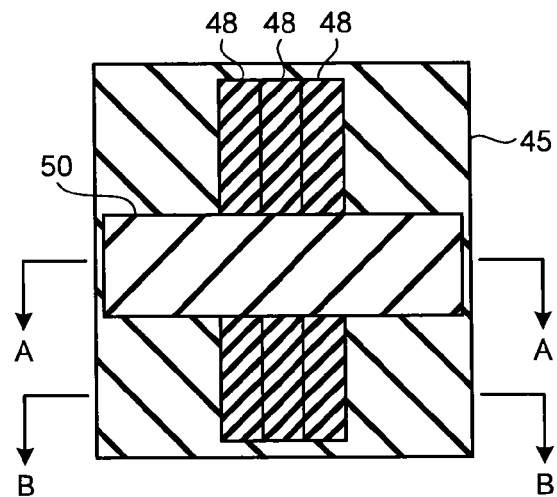
FIG. 38A is a plan view illustrating the manufacturing method of the semiconductor device according to the fourth embodiment.

In FIGS. 24A and 24B, a semiconductor layer 42 is formed on a semiconductor substrate 41 by selective epitaxial growth. A gate region R1 on which a gate electrode 49 illustrated in FIG. 38A is to be formed and a dummy-fin region R2 on which a dummy-fin semiconductor 43 illustrated in FIG. 26A is to be formed can be secured on the semiconductor substrate 41.

The same material can be used for the semiconductor substrate 41 and the semiconductor layer 42 in order to secure a lattice match. The materials for the semiconductor substrate 41 and the semiconductor layer 42 can be selected from, for example, Si, Ge, SiGe, GaAs, AlGaAs, InP, GaInAsP, GaP, InGaAs, GaN, and SiC. A monocrystal semiconductor can be used for the semiconductor substrate 41 and the semiconductor layer 42.

Figure 25A:
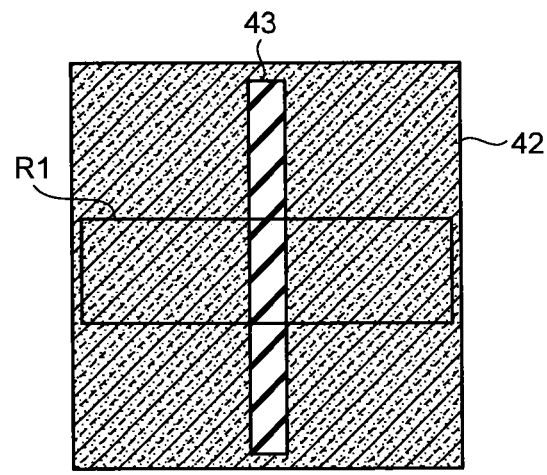
FIG. 25A is a plan view illustrating the manufacturing method of the semiconductor device according to the fourth embodiment.
Figure 25B:
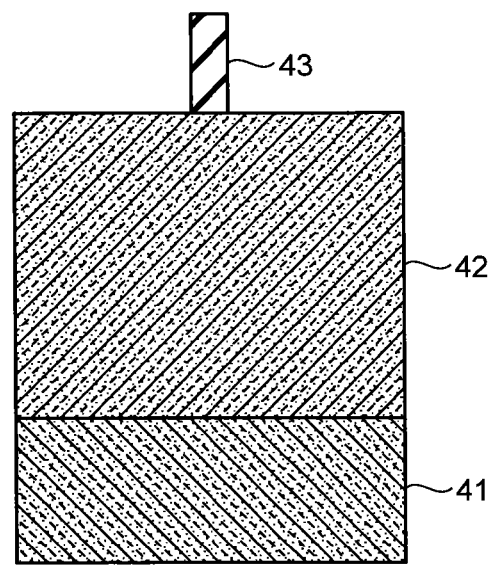
FIG. 25B is a cross-sectional view illustrating the manufacturing method of the semiconductor device according to the fourth embodiment.

Next, as illustrated in FIGS. 25A and 25B, a hard mask material is formed all over the semiconductor layer 42 by CVD. The hard mask material is patterned by photolithography and RIE, whereby a hard mask layer 43 is formed on the semiconductor layer 42. $Si_3N_4$ can be used as the material of the hard mask layer 43, for example.

Figure 26A:
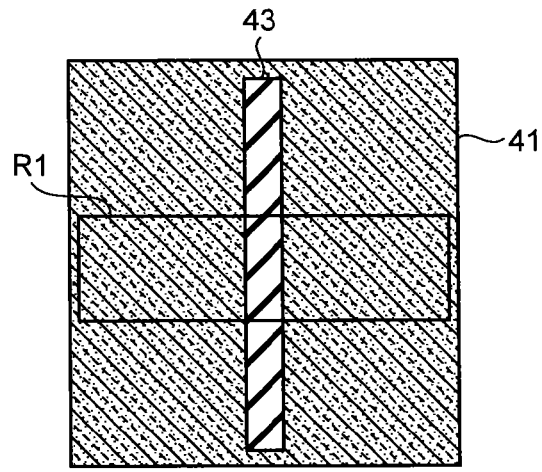
FIG. 26A is a plan view illustrating the manufacturing method of the semiconductor device according to the fourth embodiment.
Figure 26B:
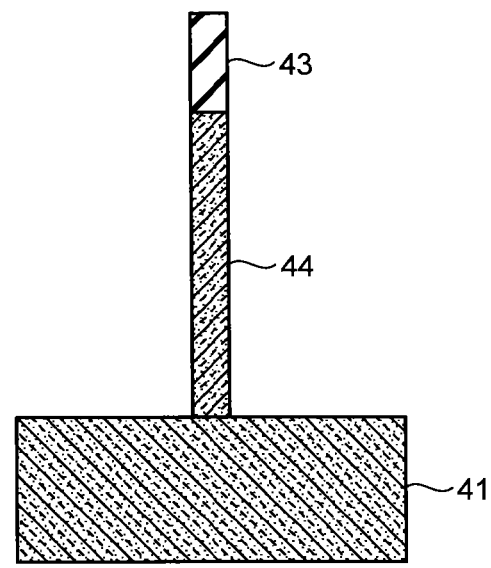
FIG. 26B is a cross-sectional view illustrating the manufacturing method of the semiconductor device according to the fourth embodiment.

Next, as illustrated in FIGS. 26A and 26B, the semiconductor layer 43 is etched by using the hard mask layer 43 as a mask, whereby a dummy-fin semiconductor 44 is formed on the semiconductor substrate 41.

Figure 27A:
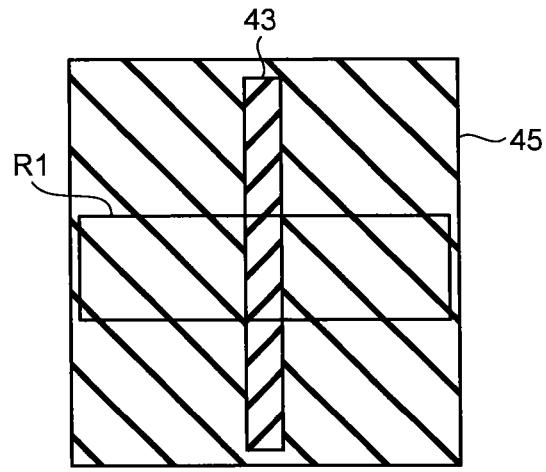
FIG. 27A is a plan view illustrating the manufacturing method of the semiconductor device according to the fourth embodiment.
Figure 27B:
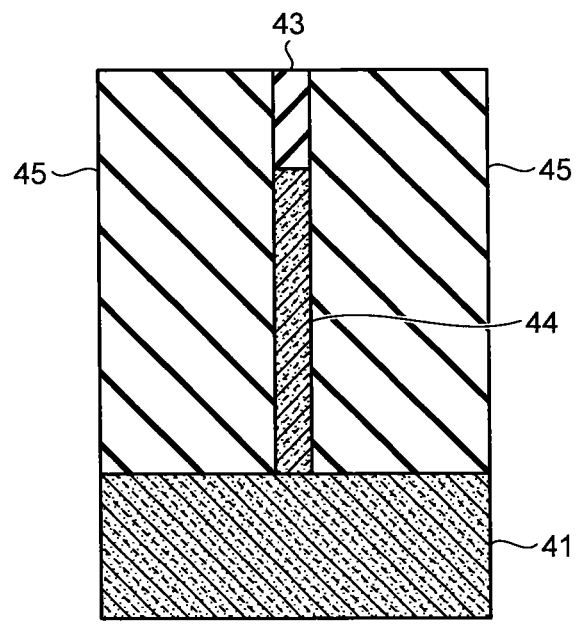
FIG. 27B is a cross-sectional view illustrating the manufacturing method of the semiconductor device according to the fourth embodiment.

Next, as illustrated in FIGS. 27A and 27B, a buried insulating layer 45 is formed on the semiconductor substrate 41 by CVD in such a manner that the dummy-fin semiconductor 44 is buried. Then, the buried insulating layer 45 is flattened by CMP until the hard mask layer 43 is exposed.

Figure 28A:
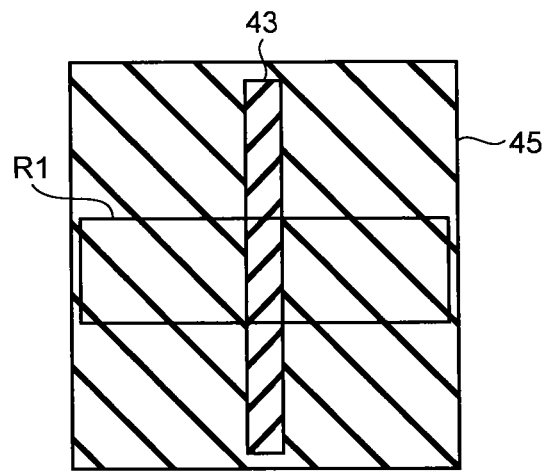
FIG. 28A is a plan view illustrating the manufacturing method of the semiconductor device according to the fourth embodiment.
Figure 28B:
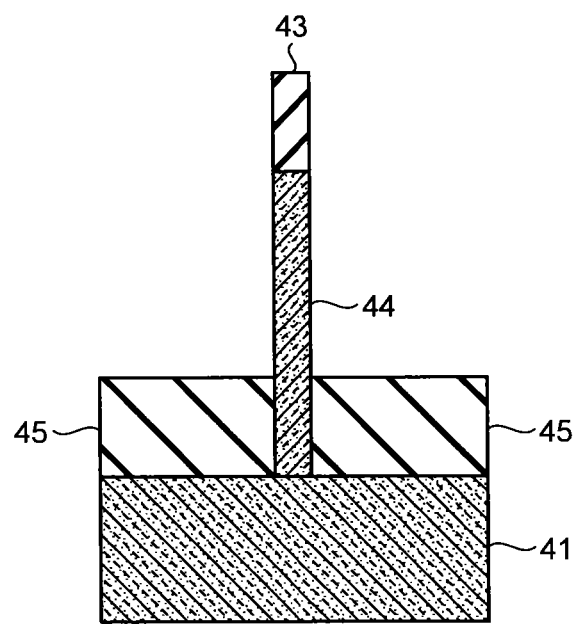
FIG. 28B is a cross-sectional view illustrating the manufacturing method of the semiconductor device according to the fourth embodiment.

Next, as illustrated in FIGS. 28A and 28B, the buried insulating layer 45 is etched back, whereby the upper part of the dummy-fin semiconductor 44 is exposed from the buried insulating layer 45 with the lower part of the dummy-fin semiconductor 44 being buried in the buried insulating layer 45.

Figure 29A:
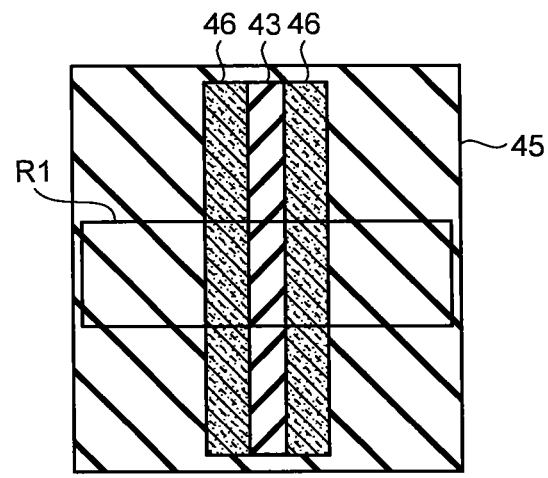
FIG. 29A is a plan view illustrating the manufacturing method of the semiconductor device according to the fourth embodiment.
Figure 29B:
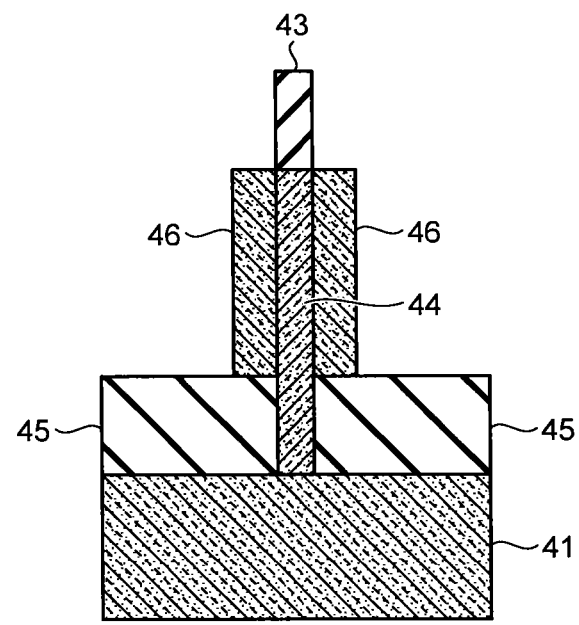
FIG. 29B is a cross-sectional view illustrating the manufacturing method of the semiconductor device according to the fourth embodiment.

Next, as illustrated in FIGS. 29A and 29B, a fin semiconductor 46 is bonded to each of the side faces of the dummy-fin semiconductor 44 is formed on the buried insulating layer 45 by selective epitaxial growth.

The same material can be used for the dummy-fin semiconductor 44 and the fin semiconductor 46 in order to secure a lattice match. The materials for the dummy-fin semiconductor 44 and the fin semiconductor 46 can be selected from, for example, Si, Ge, SiGe, GaAs, AlGaAs, InP, GaInAsP, GaP, InGaAs, GaN, and SiC.

Figure 30A:
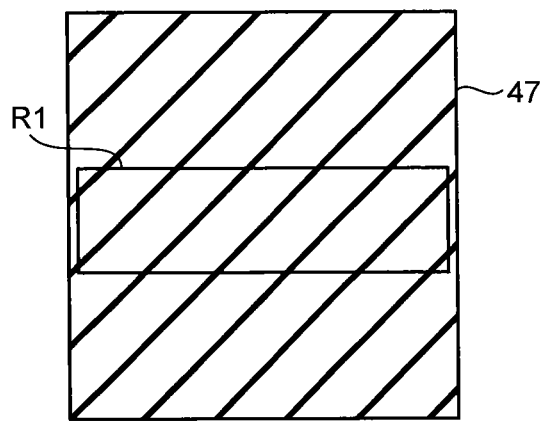
FIG. 30A is a plan view illustrating the manufacturing method of the semiconductor device according to the fourth embodiment.
Figure 30B:
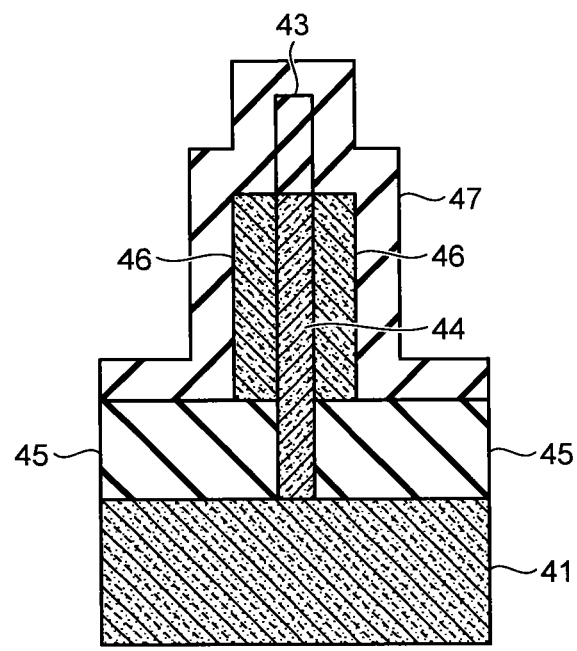
FIG. 30B is a cross-sectional view illustrating the manufacturing method of the semiconductor device according to the fourth embodiment.

Next, as illustrated in FIGS. 30A and 30B, a protection film 47 is deposited by CVD in order to cover the hard mask layer 43 and the fin semiconductor 46. $SiO_2$ can be used for the material of the protection film 47, for example.

Figure 31A:
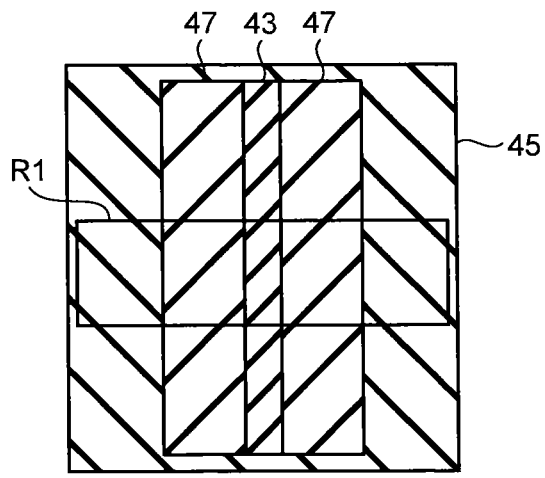
FIG. 31A is a plan view illustrating the manufacturing method of the semiconductor device according to the fourth embodiment.
Figure 31B:
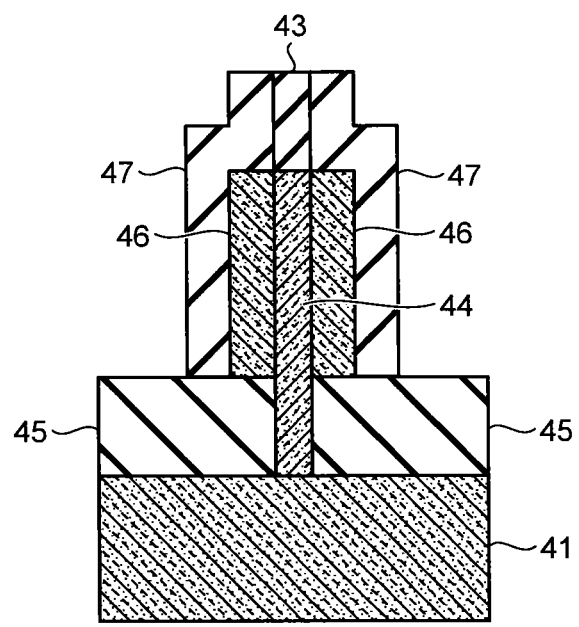
FIG. 31B is a cross-sectional view illustrating the manufacturing method of the semiconductor device according to the fourth embodiment.

Next, as illustrated in FIGS. 31A and 31B, the protection film 47 undergoes the anisotropic etching for exposing the surface of the hard mask layer 43. In this case, the fin semiconductor 46 is still covered by the protection film 47. The protection film 47 may undergo CMP by using the hard mask layer 43 as a stopper film in order to expose the surface of the hard mask layer 43.

Figure 32A:
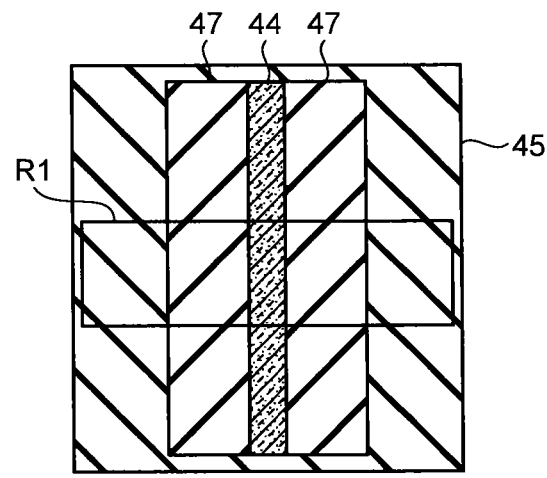
FIG. 32A is a plan view illustrating the manufacturing method of the semiconductor device according to the fourth embodiment.
Figure 32B:
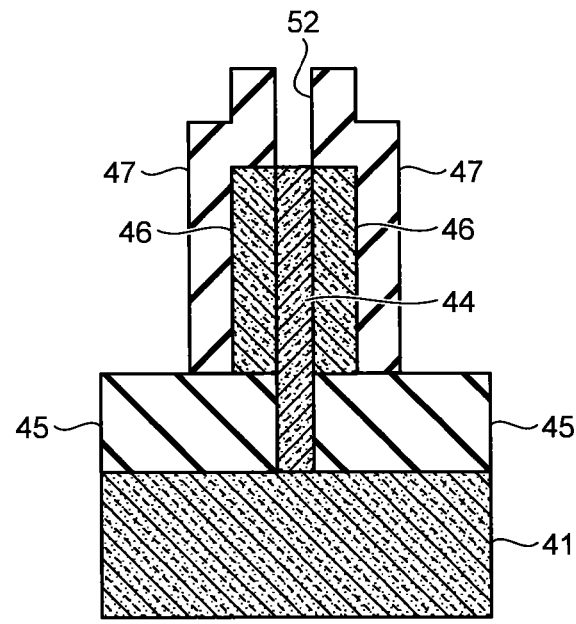
FIG. 32B is a cross-sectional view illustrating the manufacturing method of the semiconductor device according to the fourth embodiment.

Next, as illustrated in FIGS. 32A and 32B, the hard mask layer 43 on the dummy-fin semiconductor 44 is selectively removed with the fin semiconductor 46 being covered by the protection film 47, whereby an opening 52 from which the surface of the dummy-fin semiconductor 44 is exposed is formed on the protection film 47.

Figure 33A:
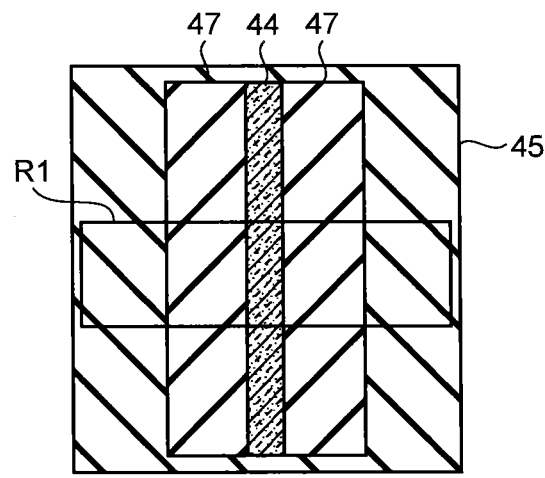
FIG. 33A is a plan view illustrating the manufacturing method of the semiconductor device according to the fourth embodiment.
Figure 33B:
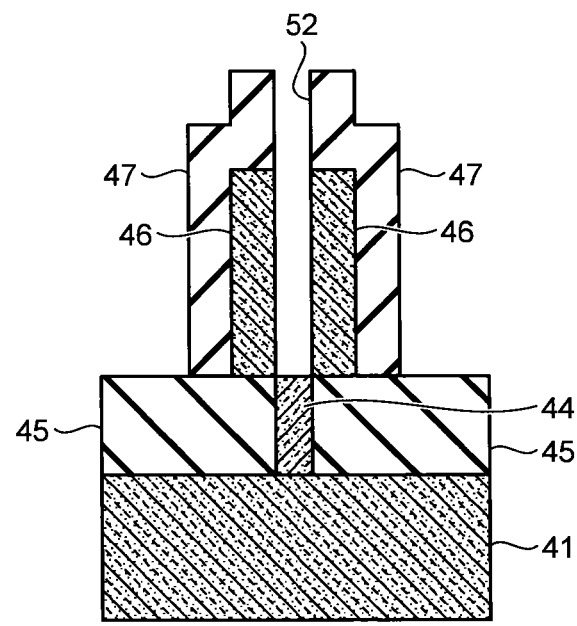
FIG. 33B is a cross-sectional view illustrating the manufacturing method of the semiconductor device according to the fourth embodiment.

Next, as illustrated in FIGS. 33A and 33B, the dummy-fin semiconductor 44 undergoes anisotropic etching through the opening 52, whereby the dummy-fin semiconductor 44 is removed with the fin semiconductor 46 being left on the buried insulating layer 45, and one side face of the fin semiconductor 46 is exposed.

Figure 34A:
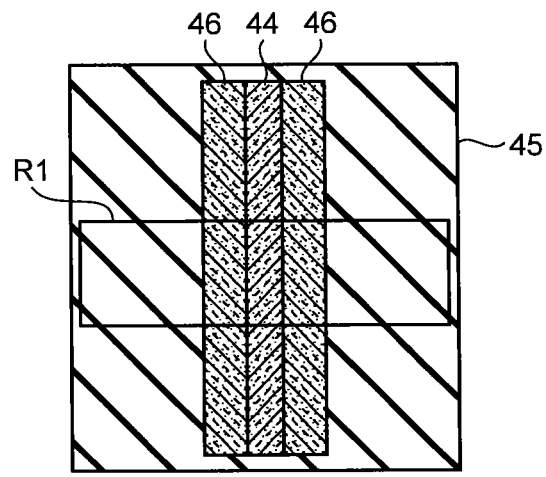
FIG. 34A is a plan view illustrating the manufacturing method of the semiconductor device according to the fourth embodiment.
Figure 34B:
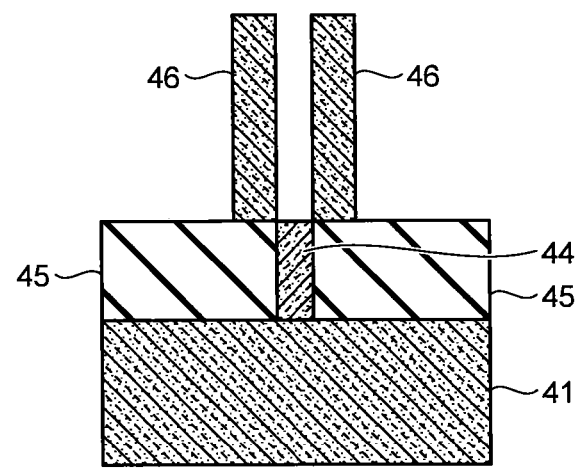
FIG. 34B is a cross-sectional view illustrating the manufacturing method of the semiconductor device according to the fourth embodiment.

Next, as illustrated in FIGS. 34A and 34B, the protection film 47 is removed from the buried insulating layer 45 by wet etching, whereby the other side face of the fin semiconductor 46 is exposed.

Figure 35A:
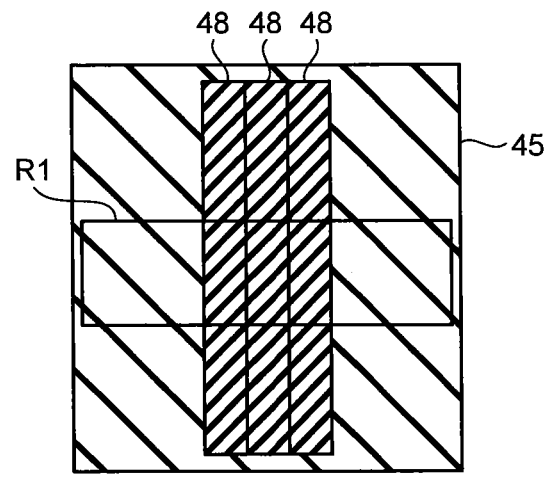
FIG. 35A is a plan view illustrating the manufacturing method of the semiconductor device according to the fourth embodiment.
Figure 35B:
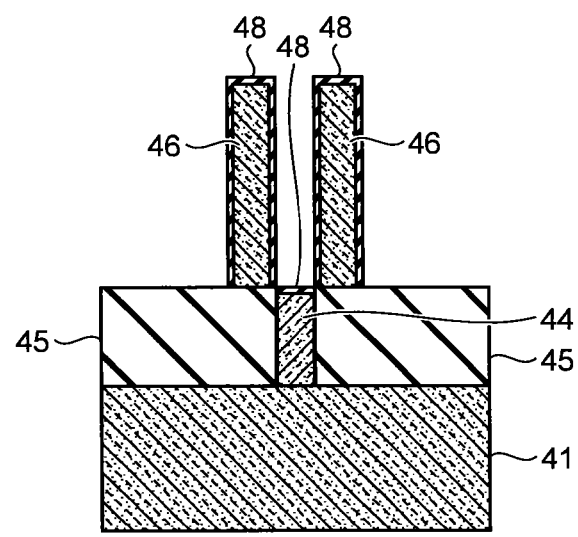
FIG. 35B is a cross-sectional view illustrating the manufacturing method of the semiconductor device according to the fourth embodiment.

Next, as illustrated in FIGS. 35A and 35B, a gate insulating film 48 is formed on the side face of the fin semiconductor 46 on the buried insulating layer 45 by thermal oxidation or CVD.

Figure 36A:
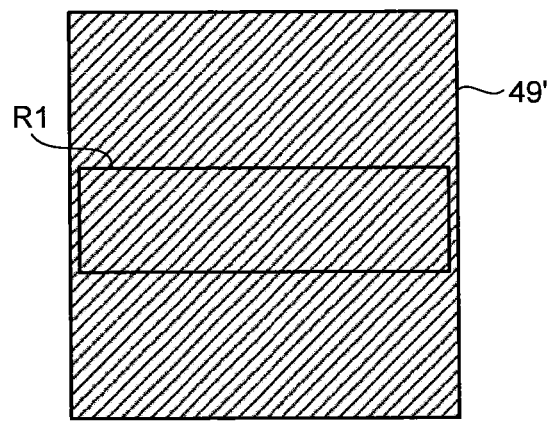
FIG. 36A is a plan view illustrating the manufacturing method of the semiconductor device according to the fourth embodiment.
Figure 36B:
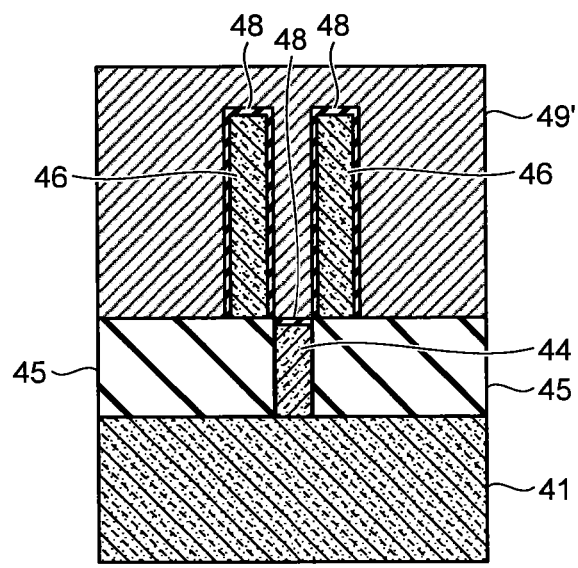
FIG. 36B is a cross-sectional view illustrating the manufacturing method of the semiconductor device according to the fourth embodiment.

Next, as illustrated in FIGS. 36A and 36B, a gate electrode material 49' is deposited by CVD in such a manner that the fin semiconductor 46 is buried.

Figure 37A:
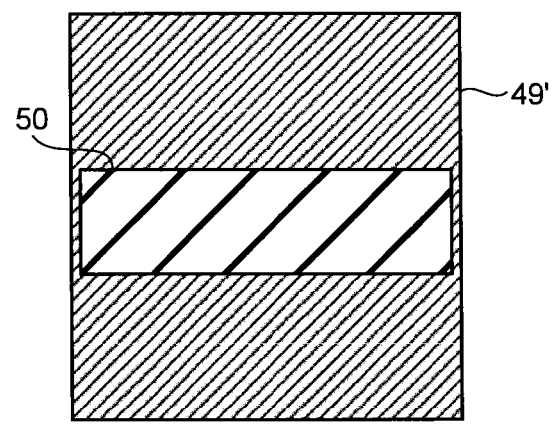
FIG. 37A is a plan view illustrating the manufacturing method of the semiconductor device according to the fourth embodiment.
Figure 37B:
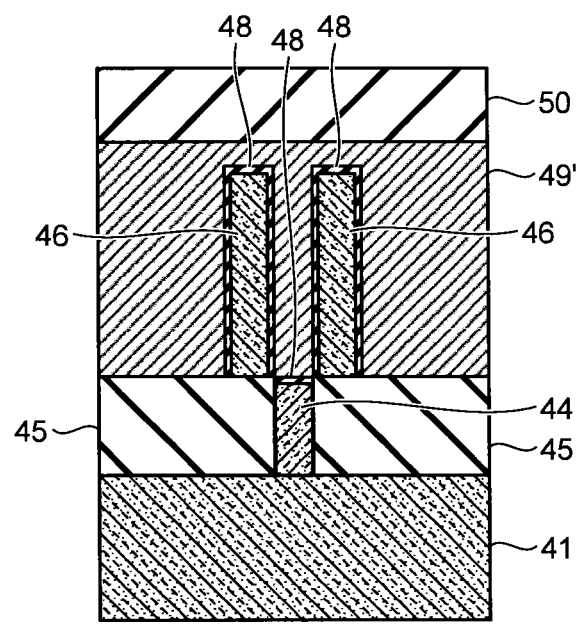
FIG. 37B is a cross-sectional view illustrating the manufacturing method of the semiconductor device according to the fourth embodiment.

Next, as illustrated in FIGS. 37A and 37B, a hard mask material is deposited on the gate electrode material 49' by CVD. Then, the hard mask material is patterned by photolithography and RIE, whereby a hard mask layer 50 is formed on the gate electrode material 49'.

Figure 38B:
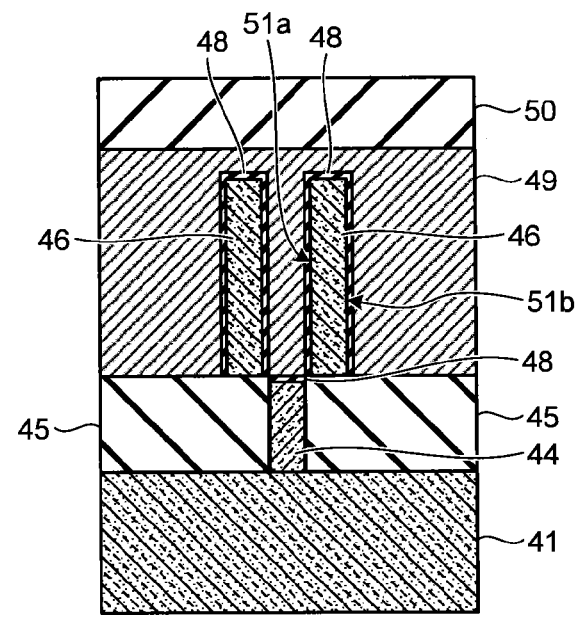
FIGS. 38B and 38C are cross-sectional views illustrating the manufacturing method of the semiconductor device according to the fourth embodiment.
Figure 38C:
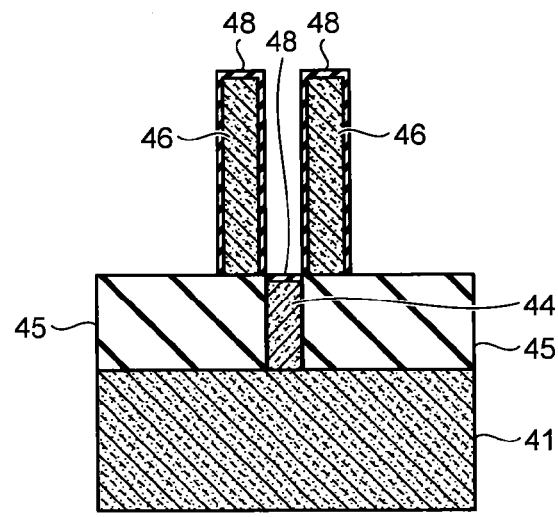

Next, as illustrated in FIGS. 38A to 38C, the gate electrode material 49' is etched by using the hard mask layer 50 as a mask, whereby a gate electrode 49 is formed on the side faces of channel regions 51a and 51b of the fin semiconductor 46 through the gate insulating film 48. In this case, as illustrated in FIG. 38C, the fin semiconductor 46 on the source and drain regions can be protected from the etching of the gate electrode by the gate insulating film 48 left on the fin semiconductor 46.

Since the same material can be used for the materials of the dummy-fin semiconductor 44 and the fin semiconductor 46, the lattice match can be secured between the dummy-fin semiconductor 44 and the fin semiconductor 46, resulting in that the crystal quality of the fin semiconductor 46 can be enhanced.

In order to remove the dummy-fin semiconductor 44 between the fin semiconductors 46, the opening 52 corresponding to the position of the dummy-fin semiconductor 44 can be formed on the protection film 47 in a self-aligned manner by using the hard mask layer 43 on the dummy-fin semiconductor 44 as a core material, whereby the dummy-fin semiconductor 44 can precisely be removed.

The above-mentioned fourth embodiment describes a method of forming the opening 52 on the protection film 47 by using the hard mask layer 43 as a core material in order to remove the dummy-fin semiconductor 44. However, the dummy-fin semiconductor 44 may be removed by using the photolithography technique.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A manufacturing method of a semiconductor device comprising:
   forming a dummy-fin semiconductor on a semiconductor substrate;
   forming an insulating layer, into which a lower part of the dummy-fin semiconductor is buried, on the semiconductor substrate;
   forming a fin semiconductor, which is bonded to a side face at an upper part of the dummy-fin semiconductor, on the insulating layer; and
   removing the dummy-fin semiconductor on the insulating layer with the fin semiconductor being left on the insulating layer.

2. The manufacturing method of a semiconductor device according to claim 1, wherein
   the dummy-fin semiconductor is made of a material having a higher etching rate than the fin semiconductor.

3. The manufacturing method of a semiconductor device according to claim 1, wherein
   first and second fin semiconductors, each having a different etching rate, are alternately and repeatedly formed on the insulating layer in the lateral direction of the dummy-fin semiconductor.

4. The manufacturing method of a semiconductor device according to claim 3, wherein
   the dummy-fin semiconductor and the second fin semiconductor on the insulating layer are removed with the first fin semiconductor being left on the insulating layer, when the second fin semiconductor has a higher etching rate than the first fin semiconductor.

5. The manufacturing method of a semiconductor device according to claim 1, wherein
   the forming the dummy-fin semiconductor on the semiconductor substrate includes:
   forming a semiconductor layer on the semiconductor substrate;
   forming a hard mask layer on the semiconductor layer; and
   etching the semiconductor layer with the hard mask layer being used as a mask.

6. The manufacturing method of a semiconductor device according to claim 5, wherein
   the forming the insulating layer, into which the lower part of the dummy-fin semiconductor is buried, on the semiconductor substrate includes:
   burying the whole dummy-fin semiconductor into the insulating layer; and
   etching back the insulating layer.

7. The manufacturing method of a semiconductor device according to claim 1, further comprising:
   forming a sidewall on the side face of the fin semiconductor, before the dummy-fin semiconductor is removed.

8. The manufacturing method of a semiconductor device according to claim 7, further comprising:
   burying a protection film on a portion from which the dummy-fin semiconductor is removed, after the dummy-fin semiconductor is removed.

9. The manufacturing method of a semiconductor device according to claim 8, further comprising:
   forming a cap layer on the fin semiconductor, after the protection film is buried in the portion from which the dummy-fin semiconductor is removed.

10. The manufacturing method of a semiconductor device according to claim 9, further comprising:
   removing the sidewall and the protection film, after the cap layer is formed on the fin semiconductor; and
   forming a gate insulating film on the side face of the fin semiconductor, after the sidewall and the protection film are removed.

11. The manufacturing method of a semiconductor device according to claim 10, further comprising:

forming a gate electrode on the side face of the fin semiconductor via the gate insulating film.

\* \* \* \* \*